(12) United States Patent
Hasegawa

(10) Patent No.: US 7,178,222 B2
(45) Date of Patent: Feb. 20, 2007

(54) METHOD OF MANUFACTURING A TUNNELING MAGNETORESISTIVE ELEMENT

(75) Inventor: Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 378 days.

(21) Appl. No.: 10/655,942

(22) Filed: Sep. 5, 2003

(65) Prior Publication Data

US 2004/0047083 A1    Mar. 11, 2004

Related U.S. Application Data

(62) Division of application No. 09/905,330, filed on Jul. 13, 2001, now Pat. No. 6,751,073.

(30) Foreign Application Priority Data

Jul. 17, 2000  (JP)  ............... 2000-216347

(51) Int. Cl.
*G11B 5/127*    (2006.01)
*H04R 31/00*    (2006.01)

(52) U.S. Cl. ............... 29/603.13; 29/603.08; 29/603.11; 29/603.14; 29/603.15; 29/603.16; 29/603.18; 216/22; 216/39; 216/40; 360/324.11; 360/324.12; 360/324.2; 360/126; 360/317; 427/127; 427/128

(58) Field of Classification Search ............... 29/603.07, 29/603.08, 603.11–603.16, 603.18; 360/324.11, 360/324.12, 324.2, 121, 122, 126, 317; 216/22, 216/39, 40; 427/127, 128; 451/5, 41
See application file for complete search history.

(56) References Cited

U.S. PATENT DOCUMENTS 5,607,599 A    3/1997   Ichihara et al.

(Continued)

FOREIGN PATENT DOCUMENTS

JP    8-1486334    6/1996

(Continued)

OTHER PUBLICATIONS

"The electrical and magnetic response of yoke-type read heads based on a magnetic tunnel junction"; Coehoorn, R.; Cumpson, S.R.; Ruigrok, J.J.M.; Hidding, P.; Magnetics, IEEE Transactions on vol. 35; Sep. 1999; pp. 2586-2588.*

(Continued)

*Primary Examiner*—Paul D. Kim
(74) *Attorney, Agent, or Firm*—Brinks Hofer Gilson & Lione

(57) ABSTRACT

Insulating layers are formed on both sides of a multilayer film, and bias layers are formed in contact with at least portions of both end surfaces of a free magnetic layer. The bias layers are formed so as not to extend to the upper surface of the multilayer film. In this construction, a sensing current from electrode layers appropriately flows through the multilayer film, and a bias magnetic field can be supplied to the free magnetic layer from the bias layers through both side surfaces of the free magnetic layer. Furthermore, the magnetic domain structure of the free magnetic layer can be stabilized to permit an attempt to decrease instability of the reproduced waveform and Barkhausen noise.

9 Claims, 20 Drawing Sheets

U.S. PATENT DOCUMENTS

| | | |
|---|---|---|
| 5,729,410 A | 3/1998 | Fontana, Jr. et al. |
| 5,877,511 A * | 3/1999 | Tanamoto et al. ............ 257/30 |
| 5,898,548 A | 4/1999 | Dill et al. |
| 5,901,018 A | 5/1999 | Fontana, Jr. et al. |
| 5,936,293 A | 8/1999 | Parkin |
| 6,005,753 A | 12/1999 | Fontana, Jr. et al. |
| 6,097,579 A * | 8/2000 | Gill ........................ 360/324.2 |
| 6,221,518 B1 | 4/2001 | Araki et al. |
| 6,266,218 B1 | 7/2001 | Carey et al. |
| 6,325,900 B1 | 12/2001 | Komuro et al. |
| 6,327,107 B1 | 12/2001 | Komuro et al. |
| 6,333,842 B1 | 12/2001 | Nobuyuki et al. |
| 6,353,318 B1 | 3/2002 | Sin et al. |
| 6,469,879 B1 | 10/2002 | Redon et al. |
| 6,504,690 B2 | 1/2003 | Komuro et al. |
| 6,556,391 B1 | 4/2003 | Aoshima et al. |
| 6,587,318 B2 | 7/2003 | Komuro et al. |
| 6,639,766 B2 | 10/2003 | Nobuyuki et al. |
| 6,721,147 B2 | 4/2004 | Aoshima et al. |
| 6,836,392 B2 * | 12/2004 | Carey et al. ........... 360/324.11 |

FOREIGN PATENT DOCUMENTS

| | | |
|---|---|---|
| JP | 9-16914 | 1/1997 |
| JP | 09161230 A * | 6/1997 |
| JP | 11-31313 | 2/1999 |
| JP | 11-175920 | 7/1999 |
| JP | 11-316919 | 11/1999 |
| JP | 11-330587 | 11/1999 |
| JP | 2001-229515 | 8/2001 |

OTHER PUBLICATIONS

Japanese Office Action dated Jun. 22, 2004 for Japanese Patent Application No. 2000-216347.

* cited by examiner

METHOD OF MANUFACTURING A TUNNELING MAGNETORESISTIVE ELEMENT

This application is a divisional application of U.S. application Ser. No. 09/905,330 filed on Jul. 13, 2001, now U.S. Pat. No. 6,751,073 entitled "Tunneling Magnetoresistive Element And Method Of Manufacturing The Same".

BACKGROUND OF THE INVENTION

1. Field of the Invention

The present invention relates to a tunneling magnetoresistive element mounted on a magnetic reproducing apparatus, for example, a hard disk device, or the like, or another magnetic sensing device. Particularly, the present invention relates to a tunneling magnetoresistive element which can stably produce a rate of change in resistance, and which can be formed with high reproducibility, and a method of manufacturing the same.

2. Description of the Related Art

FIG. 21 is a partial sectional view illustrating the structure of a conventional tunneling magnetoresistive element.

In FIG. 21, reference numeral 1 denotes an electrode layer made of, for example, Cu, W, Cr or the like.

An antiferromagnetic layer 2, a pinned magnetic layer 3, an insulating barrier layer 4 and a free magnetic layer 5 are laminated in turn to form a multilayer film 6 on the electrode layer 1.

The antiferromagnetic layer 2 is made of an existing antiferromagnetic material such as a NiMn alloy film or the like, and heat treatment of the antiferromagnetic layer 2 produces an exchange coupling magnetic field between the pinned magnetic layer 3 made of a ferromagnetic material such as a NiFe alloy film or the like and the antiferromagnetic layer 2 to pin the magnetization direction of the pinned magnetic layer 3 in the Y direction (height direction) shown in FIG. 21.

The insulating barrier layer 4 is made of an existing insulating material such as $Al_2O_3$ or the like, and the free magnetic layer is made of the same material as the pinned magnetic layer 3, such as a NiFe alloy film or the like.

Referring to FIG. 21, bias layers 9 made of a hard magnetic material such as a Co—Pt alloy film or the like are formed on both sides of the multilayer film 6 in the track width direction (the X direction shown in the drawing).

The bias layers 9 supply a bias magnetic field to the free magnetic layer 5 in the X direction shown in the drawing to orient the magnetization direction of the free magnetic layer 5 in the X direction.

As shown in FIG. 21, an electrode layer 10 is formed on the multilayer film 6 and the bias layers 9.

The tunneling magnetoresistive element serves as a reproducing magnetic element utilizing a tunneling effect for detecting a leakage magnetic field from a recording medium. When a sensing current is supplied to the multilayer film 6 from the electrode layers 1 and 10 in the Z direction shown in the drawing, a tunneling current changes based on the magnetization relation between the free magnetic layer 5 and the pinned magnetic layer 3 to cause a change in resistance, thereby detecting a recording signal by the change in resistance.

However, the structure of the tunneling magnetoresistive element shown in FIG. 21 has the following problem.

Since the sensing current supplied from the electrode layers 1 and 10 flows not only through the multilayer film 6 but also through the bias layers 9 formed on both sides of the multilayer film 6 to fail to obtain a TMR effect, thereby significantly deteriorating the function and properties of the reproducing magnetic element.

FIG. 22 shows another tunneling magnetoresistive element having a structure which is improved for resolving the above problem.

Referring to FIG. 22, insulating layers 7 made of, for example, $Al_2O_3$ or the like, are formed on both sides of the multilayer film 6 in the track width direction (the X direction shown in the drawing).

By forming the insulating layers 7, a plane surface extends on the same plane as the upper surface of the multilayer film 6, the bias layers 9 made of a hard magnetic material such as a Co—Pt film being respectively formed on the insulating layers 7 with underlying layers 8 of Cr provided therebetween.

Each of the hard magnetic bias layers 9 is formed to further extend from the insulating layer 7 to the upper surface of the multilayer film 6 by a width dimension T1. As a result, the magnetization direction of the free magnetic layer is oriented in the X direction by a bias magnetic field from the bias layers 9.

In the structure shown in FIG. 22, the insulating layers 7 are formed on both sides of the multilayer film 6, and thus the sensing current from the electrode layers 1 and 10 appropriately flows through the multilayer film 6 with less shunt current. Also, in this structure, the bias magnetic field from the bias layers 9 flows into the free magnetic layer 5 from the top thereof, not from the sides of the free magnetic layer 5.

However, the tunneling magnetoresistive element shown in FIG. 22 has the following problem.

As shown in FIG. 22, a bias magnetic field A from the bias layers 9 is oriented in the track width direction (the X direction shown in the drawing) to supply a magnetic field to the free magnetic layer 5 in the X direction. However, at the same time, a magnetic field B oriented in the direction opposite to the bias magnetic field A occurs in the portion of the free magnetic layer 5 which contacts of the extension of each of the bias layers 9 on the multilayer film 6. The occurrence of the magnetic field B destabilizes the magnetic domain structure of the free magnetic layer 5 to cause the occurrence of Barkhousen noise or destabilize a reproduced waveform, thereby deteriorating reproducing characteristics.

As described below, the structure of the magnetic element shown in FIG. 22 causes difficulties in forming the bias layers 9 with high alignment accuracy, causing variations in the width dimension T1 of the extension of each of the bias layers 9. Particularly, the bias layers 9 are formed to extend on a sensitive zone of the multilayer film 6, which substantially exhibits a magnetoresistive effect, and thus the magnetic domain structure of the sensitive zone is significantly destabilized due to the occurrence of the magnetic field B. Also, the extensions of the bias layers 9 to the sensitive region significantly decrease a zone which can exhibit the magnetoresistive effect, thereby deteriorating characteristics.

The occurrence of the magnetic field B is due to the formation of the underlying layers 8 made of Cr between the free magnetic layer 5 and the bias layers 9. The presence of the underlying layers 8 interrupts magnetic coupling between the free magnetic layer 5 and the bias layers 9.

There is thus the idea that the underlying layers 8 are removed to directly joint the free magnetic layer 5 and the bias layers 9. However, without the underlying layers 8, the coercive force of the bias layers 9 cannot be ensured to cause difficulties in controlling crystal orientation, thereby significantly deteriorating hard magnetic properties.

The method of manufacturing the tunneling magnetoresistive element shown in FIG. 22 also has the following problems.

As shown in FIG. 23, after the electrode layer 1, the multilayer film 6 and the insulating layers 7 are formed, the bias layer 9 is formed on the multilayer film 6 and the insulating layers 7.

In FIG. 24, a resist layer 11 is formed on the bias layer 9, and then exposed and developed to form an aperture pattern 11a having a predetermined with dimension in the central portion of the resist layer 11. Then, the bias layer 9 exposed from the aperture pattern 11a is removed by etching to form the bias layers 9 having the shape shown in FIG. 9.

However, it is difficult to form the aperture pattern 11a with high precision at a predetermined portion of the resist layer 11 at the top of the multilayer film 6, which has a very small width dimension, thereby causing variations in the shape of the bias layers 9 to deteriorate reproducibility.

Furthermore, in the step of etching the bias layers 9 exposed from the aperture pattern 11a, a portion of the free magnetic layer 5 below the bias layer 9 is also possibly removed to make it difficult to control the etching time or the like. Since the free magnetic layer 5 is formed to a small thickness of several tens nm, a variation occurs in the properties even when only a small amount of the free magnetic layer 5 is removed.

Also, the structure of the tunneling magnetoresistive element shown in FIG. 22 easily produces a variation in a reproducing gap. As shown in FIG. 22, the length from the lower electrode layer 1 to the upper electrode layer 10 is h1 in the central portion where the bias layers 9 are not formed on the multilayer film 6, while the length is h2 in the portion where the bias layers 9 are formed on the multilayer film 6, the length h2 being longer than the length h1. Therefore, a variation occurs in the thickness of the reproducing gap within the width dimension of the multilayer film 6 in the track width direction (the X direction shown in the drawing), easily causing an adverse effect on the reproducing characteristics.

SUMMARY OF THE INVENTION

The present invention has been achieved for solving the above problems of a conventional element, and an object of the present invention is to provide a tunneling magnetoresistive element permitting appropriate supply of a bias magnetic field to a free magnetic layer to stabilize a reproduced waveform, and a method of manufacturing the tunneling magnetoresistive element exhibiting high reproducibility of formation.

In an aspect of the present invention, there is provided a tunneling magnetoresistive element comprising a multilayer film comprising an antiferromagnetic layer, a pinned magnetic layer formed in contact with the antiferromagnetic layer so that the magnetization direction is pinned by an exchange coupling magnetic field with the antiferromagnetic layer, and a free magnetic layer formed on the pined magnetic layer with an insulating barrier layer provided therebetween, electrode layers formed above and below the multilayer film, insulating layers formed on both sides of the multilayer film in the track width direction, and domain control layers respectively formed on the insulating layers so as to contact at least portions of both side surfaces of the free magnetic layer, for orienting the magnetization direction of the free magnetic layer in a direction crossing the magnetization direction of the pinned magnetic layer, wherein the domain control layers are formed so as not to extend to the upper surface of the multilayer film.

In the present invention, the antiferromagnetic layer, the pinned magnetic layer, the insulating barrier layer and the free magnetic layer are formed in turn from the bottom to form the multilayer film, and the insulating layers and the domain control layers are formed on both sides of the multilayer film.

The domain control layers are formed in contact with at least portions of both sides surfaces of the free magnetic layer so as not to extend to the upper surface of the multilayer film.

By providing the insulating layers on both sides of the multilayer film, as described above, a sensing current from the electrode layers appropriately flows through the multilayer film to decrease a shunt loss of the sensing current, thereby improving reproduced output.

Since the domain control layers are formed in contact with both side surfaces of the free magnetic layer, a bias magnetic field from the domain control layers is appropriately supplied to the free magnetic layer through the sides thereof, permitting magnetization control of the free magnetic layer.

Furthermore, unlike in the conventional example shown in FIG. 22, the domain control layers are formed so as not to extend to the upper surface of the multilayer film, and thus the reverse magnetization field B does not occur in the free magnetic layer, thereby stabilizing the magnetic domain structure of the free magnetic layer. More specifically, the free magnetic layer can be appropriately put into a single magnetic domain structure state.

In another aspect of the present invention, there is provided a tunneling magnetoresistive element comprising a multilayer film comprising an antiferromagnetic layer, a pinned magnetic layer formed in contact with the antiferromagnetic layer so that the magnetization direction is pinned by an exchange coupling magnetic field with the antiferromagnetic layer, a free magnetic layer formed on the pined magnetic layer with an insulating barrier layer provided therebetween, electrode layers formed above and below the multilayer film, insulating layers formed on both sides of the multilayer film in the track width direction, and domain control layers formed on the insulating layers so as to contact at least portions of both side surfaces of the free magnetic layer, for orienting the magnetization direction of the free magnetic layer in a direction crossing the magnetization direction of the pinned magnetic layer, wherein the multilayer film comprises a central sensitive zone having excellent reproducing sensitivity so that a magnetoresistive effect can be substantially exhibited, and dead zones formed on both sides of the sensitive zone and having low reproducing sensitivity so that the magnetoresistive effect cannot be substantially exhibited, and the domain control layers are formed so as to extend on the multilayer film.

In the present invention, the domain control layers are formed to extend on the multilayer film, but extend only on the dead zones of the multilayer film.

In the multilayer film, not the entire region exhibits the magnetoresistive effect, but only the central area has excellent reproducing sensitivity and can substantially exhibit the magnetoresistive effect. The area having excellent reproducing sensitivity is referred to as a "sensitive zone", and the areas on both sides of the sensitive zone, which have poor reproducing sensitivity, are referred to as "dead zones". The sensitive zone and the dead zones in the multilayer film are measured by, for example, a micro-track profile method.

In the present invention, the domain control layers may be formed to extend on the dead zones. Even when as in a conventional element, underlying layers are interposed between the domain control layers and the multilayer film, for controlling the crystal orientation of the domain control layers, a reverse magnetic field (refer to reference character B shown in FIG. 22) occurring in the free magnetic layer is produced only in the dead zones thereof, thereby causing no adverse effect on the reproducing characteristics.

Furthermore, the domain control layers are formed on the dead zones, not formed on the sensitive zone, and thus the reproducing gap within the sensitive zone has a uniform thickness, causing no fear of deterioration in characteristics.

In a still another aspect of the present invention, there is provided a tunneling magnetoresistive element comprising a multilayer film comprising a free magnetic layer, a pinned magnetic layer formed on the free magnetic layer with an insulating barrier layer provided therebetween, and an antiferromagnetic layer formed on the pinned magnetic layer, for pinning the magnetization direction of the pinned magnetic layer by an exchange coupling magnetic field, electrode layers formed above and below the multilayer film, domain control layers formed on both sides of the multilayer film in the track width direction so as to contact at least portions of both side surfaces of the free magnetic layer, for orienting the magnetization direction of the free magnetic layer in a direction crossing the magnetization direction of the pinned magnetic layer, and insulating layers respectively formed on the domain control layers, wherein the insulating layers are formed so as not to extend to the upper surface of the multilayer film.

In the present invention, the free magnetic layer, the insulating barrier layer, the pinned magnetic layer and the antiferromagnetic layer are laminated in turn from the bottom to form the multilayer film.

Since the domain control layers are formed to contact at least portions of both side surfaces of the free magnetic layer, a bias magnetic field can be appropriately supplied to the free magnetic layer from the domain control layers.

Also, the insulating layers are formed on the domain control layers, and thus a sensing current from the electrode layers appropriately flows through the multilayer film to decrease a shunt loss of the sensing current, thereby permitting an attempt to improve reproduced output.

Since the insulating layers are formed so as not to extend to the upper surface of the multilayer film, no variation occurs in the thickness of the reproducing gap within the width dimension of the multilayer film in the track width direction, thereby causing no fear of deteriorating characteristics.

In a further aspect of the present invention, there is provided a tunneling magnetoresistive element comprising a multilayer film comprising a free magnetic layer, a pinned magnetic layer formed on the free magnetic layer with an insulating barrier layer provided therebetween, and an antiferromagnetic layer formed on the pinned magnetic layer, for pinning the magnetization direction of the pinned magnetic layer by an exchange coupling magnetic field, electrode layers formed above and below the multilayer film, domain control layers formed on both sides of the multilayer film in the track width direction so as to contact at least portions of both side surfaces of the free magnetic layer, for orienting the magnetization direction of the free magnetic layer in a direction crossing the magnetization direction of the pinned magnetic layer, and insulating layers formed on the domain control layers, wherein the multilayer film comprises a central sensitive zone having excellent reproducing sensitivity so that the magnetoresistive effect can be substantially exhibited, and dead zones formed on both sides of the sensitive zone and having poor reproducing sensitivity so that the magnetoresistive effect cannot be substantially exhibited, and the insulating layers are formed so as to extend on the dead zones of the multilayer film.

In the present invention, the insulating layers are formed to extend on the dead zones of the multilayer film, not on the sensitive zone thereof, and thus no variation occurs in the thickness of the reproducing gap within the sensitive zone, causing no fear of deteriorating characteristics.

In the present invention, underlying layers are preferably formed below the domain control layer, for controlling the crystal orientation of the domain control layers. This can sufficiently maintain the magnetic properties of the domain control layer.

In the present invention, with the domain control layers formed to extend on the dead zones of the multilayer film, a magnetic filed in the direction opposite to the bias magnetic field of the domain control layers occurs in the multilayer film due to the presence of the underlying layers. However, the reverse magnetic field occurs within the dead zones, and thus the reproducing characteristics are not adversely affected.

Each of the domain control layers preferably comprises a hard magnetic material.

In the present invention, each of the domain control layers may comprise a laminated film of a ferromagnetic layer and a second antiferromagnetic layer, the ferromagnetic layers being in contact with at least portions of both side surfaces of the free magnetic layer.

In the present invention, the insulating layers may comprise an antiferromagnetic insulating layer exhibiting an antiferromagnetic property, and the domain control layers may comprise a ferromagnetic layer.

In this case, the second antiferromagnetic layer or the antiferromagnetic layer is preferably made of $\alpha$-$Fe_2O_3$.

A method of manufacturing a tunneling magnetoresistive element of the present invention comprises:

(a) the step of forming an electrode layer on a substrate, and then laminating an antiferromagnetic layer, a pinned magnetic layer in which magnetization is pinned in a predetermined direction by an exchange coupling magnetic field with the antiferromagnetic layer, an insulating barrier layer and a free magnetic layer in turn from the bottom to form a multilayer film;

(b) the step of forming, on the multilayer film, a lift-off resist layer having notched portions formed on the lower side thereof;

(c) the step of removing both sides of the mulitlayer film leaving at least a portion of the multilayer film below the resist layer;

(d) the step of forming insulating layers on both sides of the multilayer film so that the multilayer film-side ends of the upper surfaces of the insulating layers are lower than both ends of the upper surface of the free magnetic layer;

(e) the step of forming domain control layers on the insulating layers by sputtering obliquely to the substrate so that the domain control layers contact both ends of the free magnetic layer, and the multilayer film-side ends of the upper surfaces of the domain control layers coincide with the both ends of the upper surface of the multilayer film; and (f) the step of removing the resist layer, and forming an electrode layer on the multilayer film and the domain control layers.

In the present invention, as described above, the lift-off resist having notched portions formed on the lower side thereof is used for forming the insulating layers and the domain control layers on both sides of the multilayer film.

Therefore, unlike a conventional manufacturing method (refer to FIGS. 23 and 24), alignment precision for forming an aperture pattern in a resist layer is unnecessary, and thus less variation occurs in the shape of the domain control layers as compared with the conventional method. Therefore, a tunneling magnetoresistive element can be manufactured with high reproducibility.

In the above-described manufacturing method, the domain control layers can be formed in contact with both side surfaces of the free magnetic layer so as not to extend to the upper surface of the multilayer film.

Another method of manufacturing a tunneling magnetoresistive element of the present invention comprises:

(a) the step of forming an electrode layer on a substrate, and then laminating an antiferromagnetic layer, a pinned magnetic layer in which magnetization is pinned in a predetermined direction by an exchange coupling magnetic field with the antiferromagnetic layer, an insulating barrier layer and a free magnetic layer in turn from the bottom to form a multilayer film;

(b) the step of forming, on a sensitive zone of the multilayer film, a lift-off resist layer having notched portions formed on the lower side thereof;

(c) the step of removing both sides of the mulitlayer film leaving at least a portion of the multilayer film below the resist layer;

(d) the step of forming insulating layers on both sides of the multilayer film so that the multilayer film-side ends of the upper surfaces of the insulating layers are lower than both ends of the upper surface of the free magnetic layer;

(e) the step of forming domain control layers on the insulating layers by sputtering obliquely to the substrate so that the domain control layers contact both ends of the free magnetic layer, and extend on dead zones of the multilayer film; and (f) the step of removing the resist layer, and forming an electrode layer on the multilayer film and the domain control layers.

This manufacturing method is capable of manufacturing a tunneling magnetoresistive element with high reproducibility, and forming the domain control layers to extend only on the dead zones of the multilayer film.

Another method of manufacturing a tunneling magnetoresistive element of the present invention comprises:

(a) the step of forming an electrode layer on a substrate, and then laminating a free magnetic layer, an insulating barrier layer, a pinned magnetic layer, and an antiferromagnetic layer for pinning magnetization of the pinned magnetic layer in a predetermined direction by an exchange coupling magnetic field in turn from the bottom to form a multilayer film;

(b) the step of forming, on the multilayer film, a lift-off resist layer having notched portions formed on the lower side thereof;

(c) the step of removing both sides of the multilayer film leaving a portion of the multilayer film below the resist layer;

(d) the step of forming domain control layers on both sides of the multilayer film so that the multilayer film-side ends contact at least portions of both ends of the free magnetic layer;

(e) the step of forming insulating layers on the domain control layers by sputtering obliquely to the multilayer film so that the multilayer film-side ends of the upper surfaces of the insulating layers coincide with both ends of the upper surface of the multilayer film; and (f) the step of removing the resist layer, and forming an electrode layer on the multilayer film and the insulating layers.

In this case, the free magnetic layer, the insulating barrier layer, the pinned magnetic layer and the antiferromagnetic layer are laminated in turn from the bottom to form the multilayer film. In addition, the domain control layers and the insulating layers are formed on both sides of the multilayer film by using the lift-off resist layer to cause less variation in the shapes of the domain control layers and the insulating layers, thereby permitting the manufacture of a tunneling magnetoresistive element with high reproducibility.

In the present invention, the insulating layers may be formed so as not to extend to the upper surface the multilayer film.

Another method of manufacturing a tunneling magnetoresistive element of the present invention comprises:

(a) the step of forming an electrode layer on a substrate, and then laminating a free magnetic layer, an insulating barrier layer, a pinned magnetic layer, and an antiferromagnetic layer for pinning magnetization of the pinned magnetic layer in a predetermined direction by an exchange coupling magnetic field in turn from the bottom to form a multilayer film;

(b) the step of forming, on a sensitive zone of the multilayer film, a lift-off resist layer having notched portions formed on the lower side thereof;

(c) the step of removing both sides of the multilayer film leaving at least a portion of the multilayer film below the resist layer;

(d) the step of forming domain control layers on both sides of the multilayer film so that the multilayer film-side ends contact at least portions of both ends of the free magnetic layer;

(e) the step of forming insulating layers on the domain control layers by sputtering obliquely to the multilayer film so that the insulating layers extend on dead zones of the multilayer film; and (f) the step of removing the resist layer, and forming an electrode layer on the multilayer film and the insulating layers.

In this case, a tunneling magnetoresistive element can be manufactured with high reproducibility. Also, the insulating layers can be formed to extend only on the dead zones of the multilayer film.

In the present invention, underlying layers are preferably formed below the domain control layers, for controlling crystal orientation of the domain control layers. The underlying layers can be formed in the same step as the insulating layers and the domain control layers.

In the present invention, in the step (d), (j), (p) or (v), the insulating layers or the domain control layers are preferably formed by sputtering vertically to the substrate.

In the present invention, each of the domain control layers preferably comprises a hard magnetic material or a laminated film of a ferromagnetic layer and a second antiferromagnetic layer, the ferromagnetic layers being brought into contact with at least portions of both side surfaces of the free magnetic layer.

In the present invention, each of the insulating layers may comprise an antiferromagnetic insulating layer exhibiting antiferromagnetism, and each of the domain control layers may comprise a ferromagnetic layer.

In the present invention, the second antiferromagnetic layer or the antiferromagnetic insulating layer exhibiting antiferromagnetism may be made of $\alpha\text{-}Fe_2O_3$.

DESCRIPTION OF THE PREFERRED EMBODIMENTS

Figure 1:
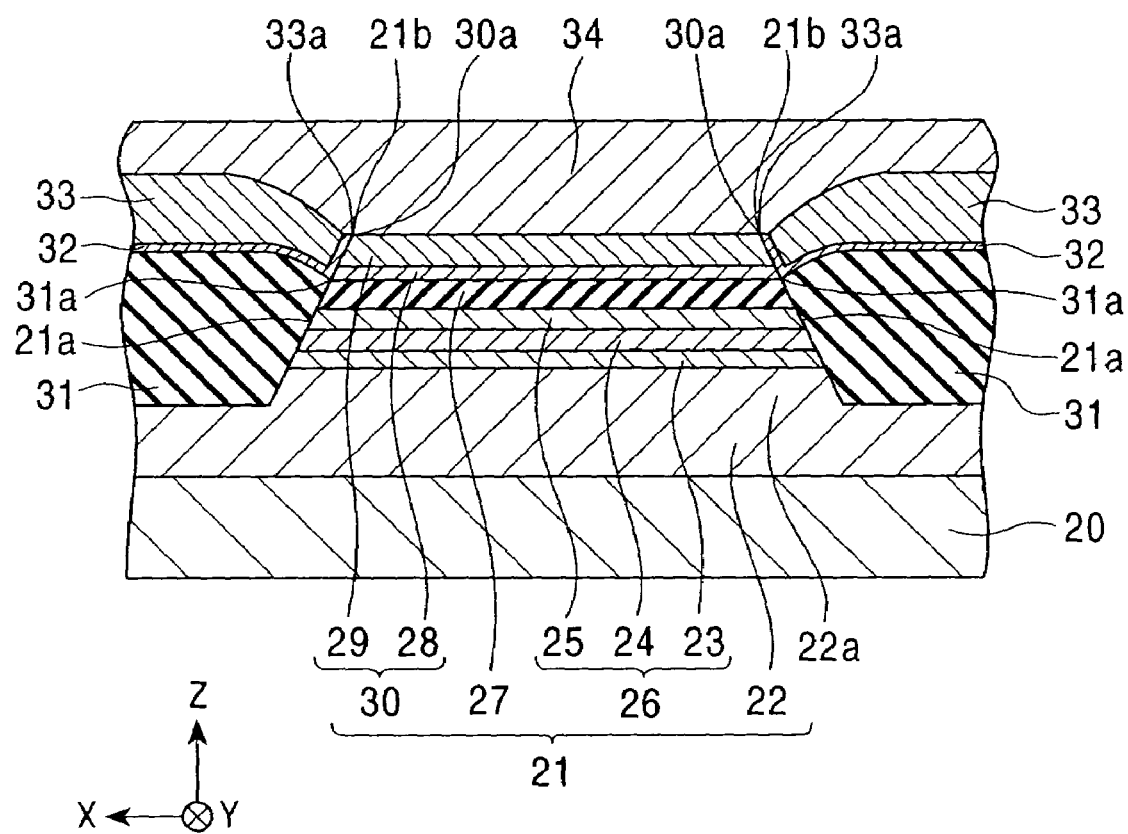
FIG. 1 is a partial sectional view showing the structure of a tunneling magnetoresistive element according to an embodiment of the present invention.

FIG. 1 is a partial sectional view showing the structure of a tunneling magnetoresistive element of the present invention.

In FIG. 1, reference numeral 20 denotes an electrode layer made of, for example, W (tungsten), Cr (chromium), or the like.

A multilayer film 21 is formed on the electrode layer 20 to have both side surfaces 21a which are inclined so that the width dimension increases in the downward direction of the drawing. In the present invention, the multilayer film 21 has the following construction.

As shown in FIG. 1, an antiferromagnetic layer 22 is formed on the electrode layer 20. The antiferromagnetic layer 22 preferably comprises a X—Mn alloy (wherein X is at least one element of Pt, Pd, Ir, Rh, Ru, and Os). Particularly, Pt is preferably selected as X to use a PtMn alloy for the antiferromagnetic layer 22.

In the present invention, the antiferromagnetic layer 22 may comprise a X—Mn—X' alloy (wherein X' is ate least one element of Ne, Ar, Kr, Xe, Be, B, C, N, Mg, Al, Si, Pt, V, Cr, Fe, Co, Ni, Cu, Zn, Ga, Ge, Zr, Nb, Mo, Ag, Cd, Sn, Hf, Xa, W, Re, Au, Pd, and the rare earth elements).

The X—Mn or X—Mn—X' alloy has excellent corrosion resistance, a high blocking temperature and a high exchange coupling magnetic field (exchange anisotropic magnetic field), as compared with a NiMn alloy and FeMn alloy used for conventional antiferromagnetic layers.

The antiferromagnetic layer 22 has a protrusion 22a formed near the center thereof to protrude in the Z direction shown in the drawing. A pinned magnetic layer 26 comprising three layers is formed on the protrusion 22a.

The pinned magnetic layer 26 comprises ferromagnetic layers 23 and 25, and a nonmagnetic layer 24 provided therebetween.

Each of the ferromagnetic layers 23 and 25 comprises, for example, a NiFe alloy film, a Co film, a CoNiFe alloy film, a CoFe alloy film, or the like. The nonmagnetic layer 24 is composed of Ru, Rh, Ir, Cr, Re, Cu, or the like.

Although heat treatment produces an exchange coupling magnetic field between the pinned magnetic layer 26 and the antiferromagnetic layer 22, the magnetization directions of the ferromagnetic layers 22 and 25 are made antiparallel to each other by the exchange coupling magnetic field. For example, the ferromagnetic layer 23 is magnetized in the Y direction shown in the drawing, and the ferromagnetic layer 25 is magnetized in the direction opposite to the Y direction. This is referred to as a "ferrimagnetic state". This construction can stabilize the magnetization state of the pinned magnetic layer 26, and increase the exchange coupling magnetic field produced at the interface between the pinned magnetic layer 26 and the antiferromagnetic layer 22.

An insulating barrier layer 27 is formed on the pinned magnetic layer 26. The insulating barrier layer 27 is preferably made of an insulating material, for example, an oxide of at least one element selected from Al, Mg, Nb, Ni, Gd, Ge, Si and Hf. Namely, the insulating barrier layer 27 is made of $Al_2O_3$, $AlO_x$, $GeO_x$, NiO, $GdO_x$, MgO, or the like.

The insulating barrier layer 27 may be made of a paramagnetic insulating material comprising a perovskite-type oxide $R_{1-x}A_xMnO_3$ (R is at least one element selected from trivalent rare earth ions such as $La^{3+}$, $Pr^{3+}$, $Nd^{3+}$, and the like, trivalent alkali earth ions such as $Ca^{2+}$, $Sr^{2+}$, $Ba^{2+}$, and the like). In this case, R and A are preferably $La^{3+}$ and $Sr^{2+}$, respectively, and the composition ratio x is preferably 0.26 or less. Alternatively, R and A are preferably $Pr^{3+}$ and $Ca^{2+}$, respectively.

In the present invention, the insulating barrier layer 27 preferably has a granular structure in which metal fine particles are dispersed in an insulating matrix.

Furthermore, a free magnetic layer 30 comprising two layers is formed on the insulating barrier layer 27. A layer 28, i.e., a layer 28 formed in contact with the insulating barrier layer 27, preferably comprises a Co film or a CoFe alloy film. A layer 29 comprises a NiFe alloy film, a CoNiFe alloy film, a CoFe alloy film, or the like. It was confirmed that by providing a Co film or a CoFe alloy film in contact with the insulating barrier layer 27, the rate of change in resistance can be improved.

Next, insulating layers 31 are formed on the antiferromagnetic layer 22 to be located on both sides of the multilayer film 21 in the track width direction (the X direction shown in the drawing), and bias layers (domain control layers) 33 are formed on the insulating layers 31.

The insulating layers are preferably made of, for example, AlO, $Al_2O_3$, $SiO_2$, $Xa_2O_5$, XiO, AlN, AlSiN, SiN, SiN, $Si_3N_4$, NiO, WO, $WO_3$, BN, CrN, or SiON.

The bias layers 33 formed on the insulating layers 31 with underlying layers 32 provided therebetween are formed for orienting the magnetization direction of the free magnetic layer 30 in the track width direction (the X direction shown in the drawing). In the tunneling magnetoresistive element shown in FIG. 1, each of the bias layers 33 comprises a hard magnetic material, for example, a Co—Pt alloy film, a Co—Cr—Pt alloy film, or the like.

The underlying layers 32 respectively formed below the bias layers 33 are provided for controlling crystal orientation of the bias layers 33 to ensure coercive force. When each of the bias layers 33 comprises a hard magnetic material as described above, each of the underlying layers 32 comprises a Cr film, a bcc-Fe film, a Fe—Co alloy film, or the like.

Furthermore, as shown in FIG. 1, an electrode layer 34 made of the same material as the electrode layer 20 is formed on the multilayer film 21 and the bias layers 33.

In the structure of the tunneling magnetoresistive element shown in FIG. 1, the bias layers 33 are formed in contact with at least portions of both side surfaces of the free magnetic layer 30 in the track width direction (the X direction). In this structure, a bias magnetic field is supplied to the end surfaces of the free magnetic layer 30 from the bias layers 33 in the track width direction to orient the magnetization direction of the free magnetic layer 30 in the X direction.

With the bias layers 33 each comprising a hard magnetic material, the insulating layers 31 may be partially inserted by about 10 nm or less in the interfaces between the side surfaces of the free magnetic layer 30 and the bias layers 33.

In order to form the bias layers 33 in contact with portions of both side surfaces of the free magnetic layer 30, the insulating layers 31 must be formed below the bias layers 33 so that the multilayer film-side ends 31a of the upper surfaces of the insulating layers 31 are lower than the ends 30a of the upper surface of the free magnetic layer 30. This structure can easily be formed with high reproducibility by the manufacturing method which will be described below.

In the embodiment shown in FIG. 1, the multilayer film-side ends 33a of the upper surfaces of the bias layers 33 coincide with both ends 21b of the upper surface of the multilayer film 21, and the bias layers 33 are formed so as not to extend to the upper surface of the multilayer film 21.

Figure 22:
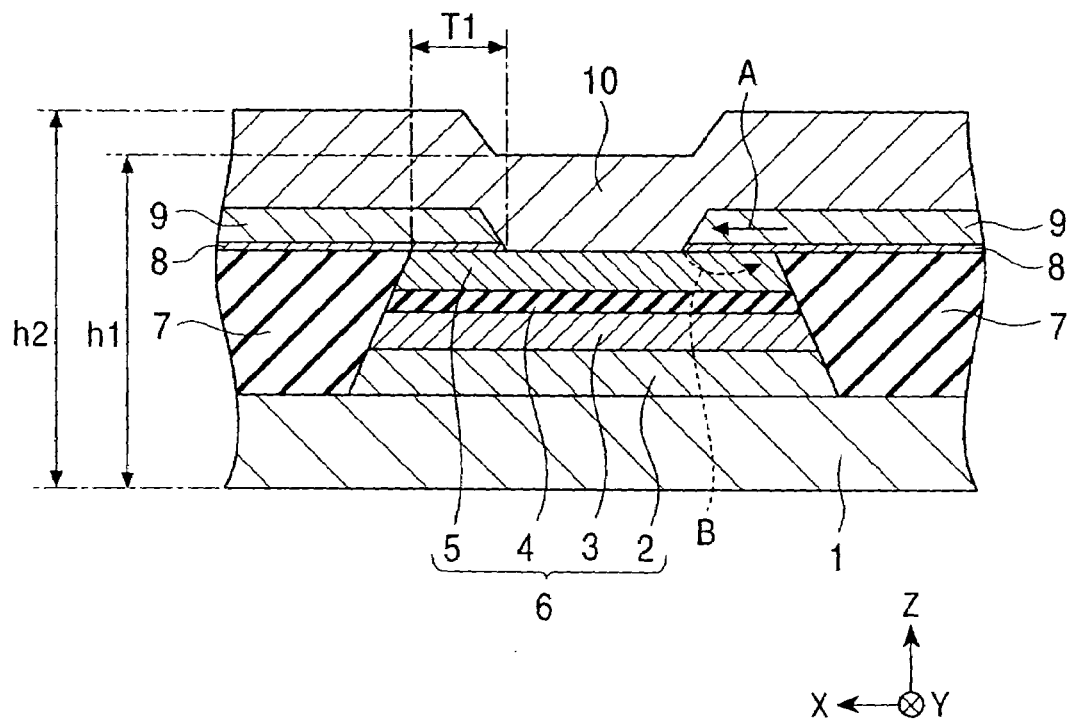
FIG. 22 is a partial schematic view showing the structure of another conventional tunneling magnetoresistive element.
Figure 23:
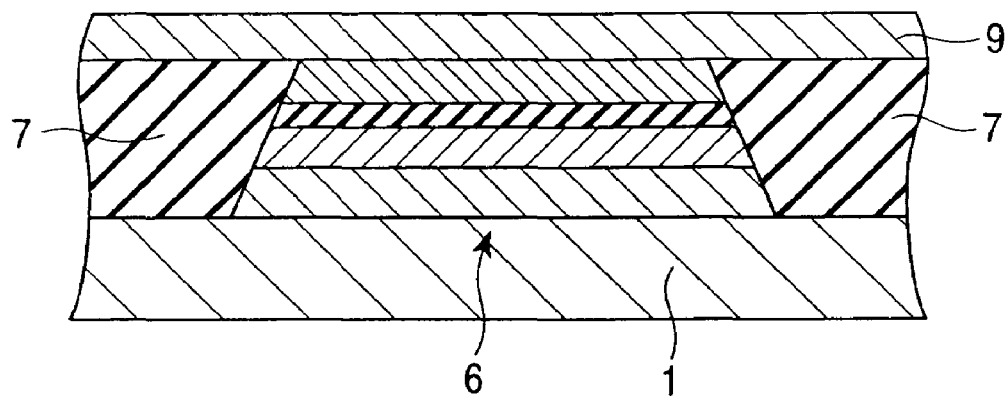
FIG. 23 is a drawing showing a step of a method of manufacturing the tunneling magnetoresistive element shown in FIG. 22.

In comparison with the conventional example shown in FIG. 22, the bias layers 9 shown in FIG. 22 are formed to extend to the upper surface of the multilayer film 6 as described above, and thus the magnetic field B in the direction opposite to the bias magnetic field A occurs in the free magnetic layer 5 in contact with the extended portion of each of the bias layers 9, thereby causing a factor of destabilization of the magnetic domain structure of the free magnetic layer 5.

On the other hand, in the present invention, the bias layers are formed not to extend to the upper surface of the multilayer film 21. Therefore, the above-described magnetic field reverse to the bias magnetic field does not occur in the free magnetic layer 30. Thus, in the present invention, the domain structure of the free magnetic layer 30 can be stabilized to easily put the magnetization of the free magnetic layer into a single magnetic domain state.

Also, the case shown in FIG. 22 has a problem in which the extensions of the bias layers 9 to the upper surface of the multilayer film 6 cause a difference in the reproducing gap length between the portion where each of the bias layers is extended, and the portion where the bias layers are not extended, within the width dimension of the multilayer film 6 in the track width direction. While in the present invention, the bias layers 33 are formed not to extend to the upper surface of the multilayer film 6, and thus the reproducing gap length is uniform within the width dimension of the multilayer film 6 in the track width direction, thereby maintaining good reproducing characteristics.

In the tunneling magnetoresistive element shown in FIG. 1, a sensing current from the electrode layers 20 and 24 flows through the multilayer film 21 in the Z direction shown in the drawing. The magnitude of the tunneling current passing through the multilayer film 21 depends upon the relation between the magnetization directions of the pinned magnetic layer 26 and the free magnetic layer 30.

When an external magnetic field enters the tunneling magnetoresistive element in the Y direction, magnetization of the free magnetic layer 30 is changed by the influence of the external magnetic field. This causes a change in the magnitude of the tunneling current so that the change in amount of the current is detected as a change in electric resistance. Therefore, the change in electric resistance can be detected as a change in voltage to detect the external magnetic field from a recording medium.

In the present invention, the insulating layers 31 are formed on both sides of the multilayer film 21 in the track width direction (the X direction), and thus less shunt current occurs in the sensing current from the electrode layers 20 and 34. Therefore, the sensing current appropriately flows through the multilayer film 21 in the Z direction, permitting an attempt to improve the reproduced output of the element.

As described above, the bias layers 33 are formed on both sides of the free magnetic layer 30 in the track width direction, and thus a bias magnetic field can be supplied to the free magnetic layer 30 through the side surfaces to appropriately orient the magnetization direction of the free magnetic layer 30 in the track width direction.

Furthermore, the bias layers 33 are formed not to extend to the upper surface of the multilayer film 21, and thus the domain structure of the free magnetic layer can be stabilized, thereby permitting an attempt to decrease instability of a reproduced waveform and Barkhausen noise. Also, the reproducing gap can be uniformly formed within the width dimension of the multilayer film 21 in the track width direction.

Figure 2:
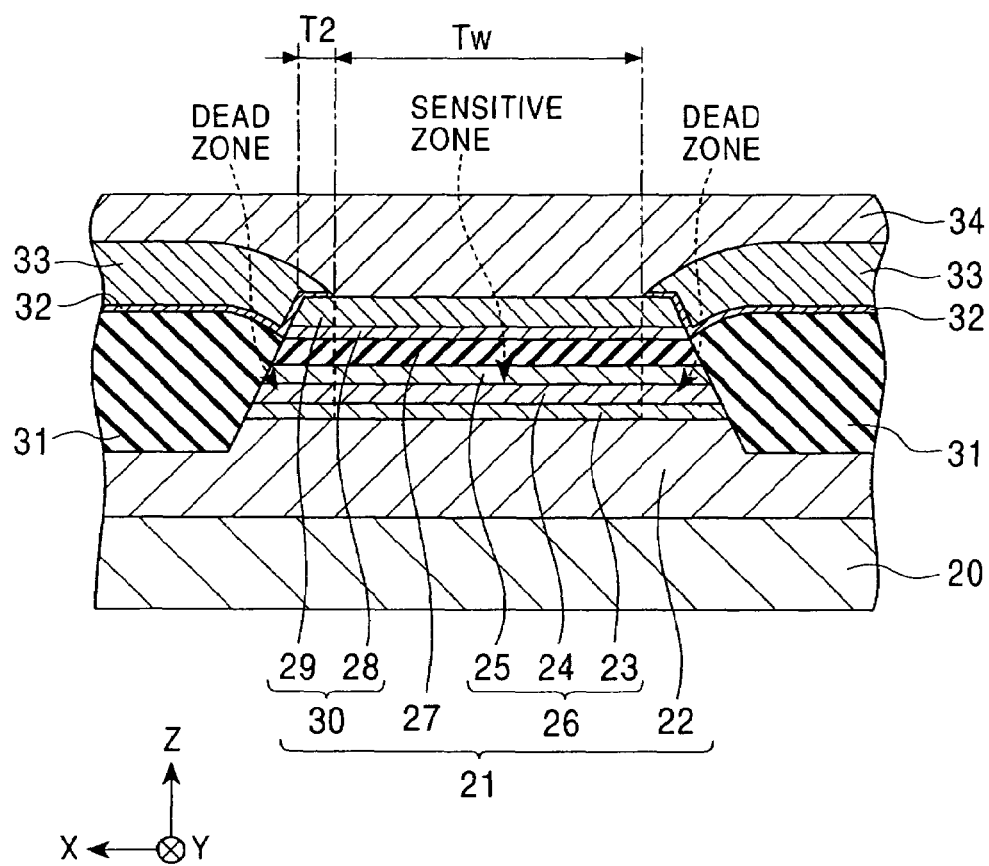
FIG. 2 is a partial sectional view showing the structure of a tunneling magnetoresistive element according to another embodiment of the present invention.

FIG. 2 is a partial sectional view showing the structure of a tunneling magnetoresistive element according to another embodiment of the present invention.

This tunneling magnetoresistive element shown in FIG. 2 is different from that shown in FIG. 1 only in the structure of the bias layers 33, and the structures and materials of other layers are the same as FIG. 1.

Namely, in the structure shown in FIG. 2, the multilayer film 21 comprises the antiferromagnetic layer 22, the pinned magnetic layer 26, the insulating barrier layer 27 and the free magnetic layer 30, which are laminated in turn from the bottom, and the insulating layers 31, the underlying layers 32 and the bias layers 33 are formed on both sides of the multilayer film 32 in the track width direction (the X direction).

The bias layers 33 are formed in contact with at least portions of both side surfaces of the free magnetic layer 30 in the track width direction (the X direction). In this structure, a bias magnetic field is supplied to the free magnetic layer 30 from the bias layers 33 through the side surfaces of the free magnetic layer 30 in the X direction, thereby orienting the magnetization direction of the free magnetic layer 30 in the X direction.

As shown in FIG. 2, the bias layers 33 are formed to extend to the upper surface of the multilayer film 21, but the bias layers 33 are formed only on the dead zones of the multilayer film 21, not formed on the sensitive zone thereof.

The dead zones and the sensitive zone are measured by a micro-track profile method.

In the micro-track profile method, a signal recorded on a microtrack is scanned with the tunneling magnetoresistive element in the track width direction. The area where an output of 50% or more of the maximum reproduced output is obtained is defined as the sensitive zone, and the areas on both sides of the sensitive zone are defined as the dead zones where output is 50% or less of the maximum output. In the dead zones, the reproducing function is ineffective, and only the DC resistance (DCR) is simply increased.

On the other hand, in the sensitive zone, the reproducing function is effective, and the magnetoresistive effect is substantially exhibited. Therefore, the width dimension of the sensitive zone in the track width direction substantially corresponds to a track width Tw (or a magnetic track width M-Tw). By the way, the minimum width dimension between the bias layers 33 on the upper surface of the multilayer film 21 is referred to as an "optical track width O-Tw", and the track width Tw generally means the optical track width.

In the present invention, the bias layers 33 may be formed to extend on the dead zones. The extension of the bias layers 33 produces a magnetic field in the dead zones in the direction opposite to the bias magnetic field of the bias layers 33.

However, in each of the dead zones, a longitudinal bias magnetic field is actually strongly applied in the forward direction to make the area insensitive, and thus the domain structure is unlikely to be made unstable even when the reverse magnetic field is applied from the extension of each of the bias layers.

Furthermore, even if the dead zones lose the reproducing function to destabilize the domain structures thereof, no problem occurs in the reproducing function as long as the domain structure of the sensitive zone is stabilized. In addition, each of the dead zones has a small area having a width dimension of about 30 nm at the most. Therefore, even when a local reverse magnetic field is applied to the small areas, the wide sensitive zone having a large width dimension is less affected by the reverse magnetic field. Therefore, the tunneling magnetoresistive element of the present invention has an appropriate reproducing function.

In the present invention, the ratio of the width dimension T2 of the extension of each of the bias layers 33 on the multilayer film 21 to the width dimension of the upper surface of the multilayer film 21 is 0%<(width dimension T2/width dimension of upper surface of the multilayer film 21)≦10%. This can avoid the bias layers 33 from being formed to extend on the sensitive zone, thereby maintaining appropriate reproducing characteristics.

Specifically, the width dimension T2 is preferably 0 nm<T2≦30 nm. This can avoid the bias layers 33 from being formed to extend on the sensitive zone, thereby maintaining appropriate reproducing characteristics.

In the structure shown in FIG. 2, the bias layers 33 are formed not to extend on the sensitive zone of the multilayer film 21, and thus the reproducing gap length within the width dimension of the sensitive zone in the track width direction is uniform, thereby maintaining appropriate reproducing characteristics.

Figure 3:
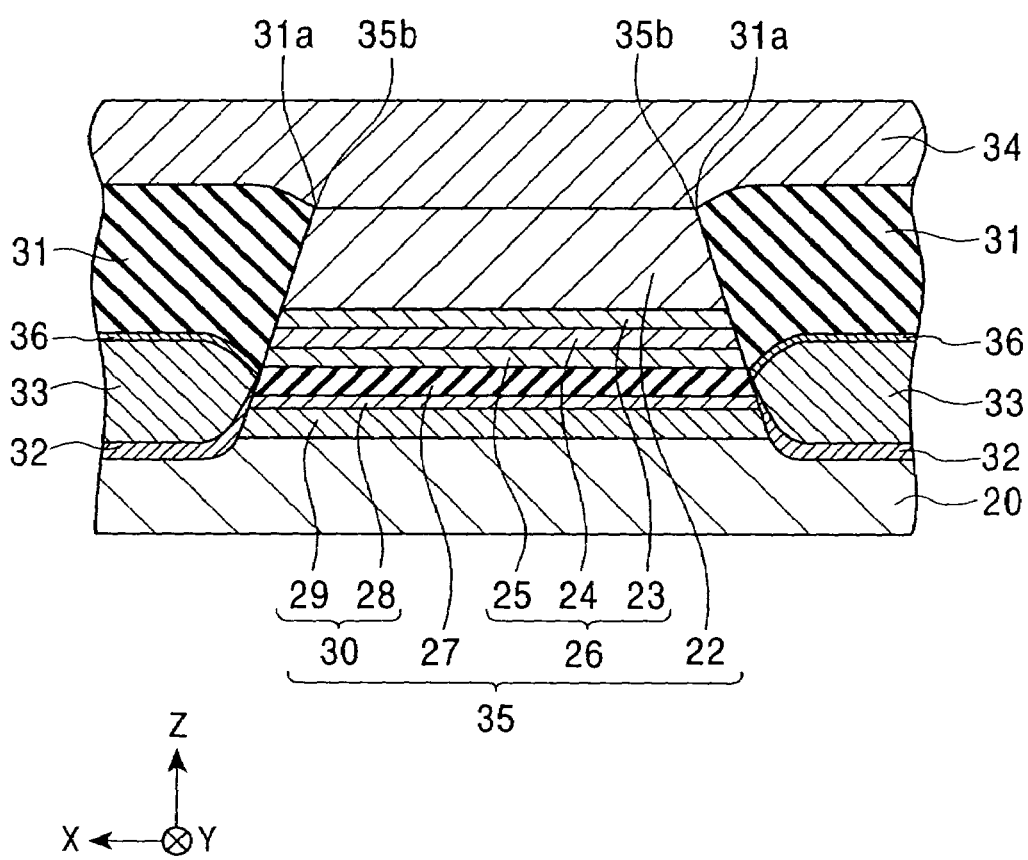
FIG. 3 is a partial sectional view showing the structure of a tunneling magnetoresistive element according to still another embodiment of the present invention.

FIG. 3 is a partial sectional view showing the structure of a tunneling magnetoresistive element according to still another embodiment of the present invention.

As shown in FIG. 3, a multilayer film 35 is formed on an electrode layer 20. The order of lamination of layers which constitute the multilayer film 35 is opposite to the multilayer film 21 shown in FIGS. 1 and 2.

Namely, a free magnetic layer 30, an insulating barrier layer 27, a pinned magnetic layer 26 and an antiferromagnetic layer 22 are laminated in that order from the bottom. A material of each of the layers is the same as described above with reference to FIG. 1.

Also, bias layers 33 are formed on both sides of the multilayer film 35 in the track width direction (the X direction shown in the drawing) on the electrode layer 20 with underlying layers 32 provided therebetween and each comprising a Cr film or the like. The underlying layers 32 control crystal orientation of the bias layers 33 to secure coercive force of the bias layers 33. Therefore, the hard magnetic properties of the bias layers 33 are sufficiently maintained.

The bias layers 33 are formed in contact with at least portions of both side surfaces of the free magnetic layer 30. Therefore, a bias magnetic field is supplied to the free magnetic layer 30 from the bias layers 33 through the end surfaces of the free magnetic layer 30 in the track width direction (the X direction shown in the drawing) to orient the magnetization direction of the free magnetic layer 30 in the X direction.

As shown in FIG. 3, insulating layers 31 are formed on the bias layers 33 with nonmagnetic intermediate layers 36 provided therebetween and made of Ta or the like. The nonmagnetic intermediate layers 36 are not necessarily formed.

As shown in FIG. 3, the insulating layers 31 are formed not to extend to the upper surface of the multilayer film 35, and the multilayer film-side ends 31a of the upper surfaces of the insulating layers 31 coincide with both ends 35b of the multilayer film 35.

Therefore, the length of the reproducing gap is uniform within in the width dimension of the multilayer film in the track width direction, thereby sufficiently maintaining the reproducing characteristics.

In this embodiment, the insulating layers 31 are formed on both sides of the multilayer film 35 in the track width direction, and thus a sensing current from the electrode layers 20 and 34 appropriately flows through the multilayer film 35 with less shunt current, thereby sufficiently maintaining the reproducing characteristics.

In the structure shown in FIG. 3, the bias layers 33 can be formed in contact with both end surfaces of the free magnetic layer 30, and thus the magnetic domain structure of the free magnetic layer 30 can be stabilized to decrease instability of the reproduced waveform and Barkhausen noise.

Figure 4:
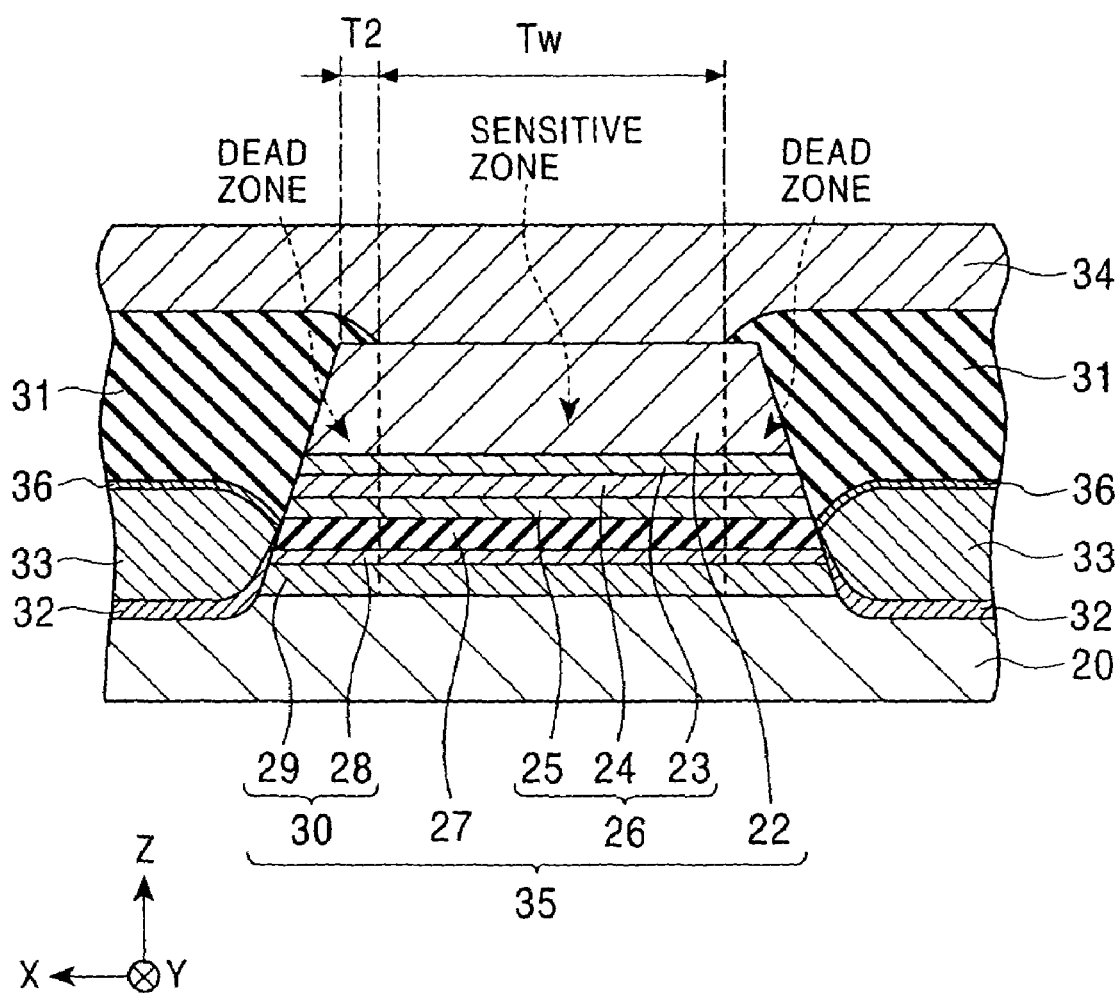
FIG. 4 is a partial sectional view showing the structure of a tunneling magnetoresistive element according to a further embodiment of the present invention.

FIG. 4 is a partial sectional view showing the structure of a tunneling magnetoresistive element according to a further embodiment of the present invention.

The structure shown in FIG. 4 is different from that shown in FIG. 3 only in the structure of insulating layers 31, and the structures and materials of other layers are the same as those shown in FIG. 1.

As shown in FIG. 4, the insulating layers 31 are formed to extend on the dead zones of the multilayer film 35.

The ratio of the width dimension T2 of the extension of each of the insulating layers 31 to the width dimension of the upper surface of the multilayer film 35 in the track width direction (the X direction shown in the drawing) is preferably 0%<(width dimension T2/width dimension of the upper surface of the multilayer film)≦10%. Specifically, the width dimension T2 is preferably 0 nm<T2≦30 nm. This permits the formation of the insulating layers 31 only on the dead zones of the multilayer film 35, and avoid the insulating layers 31 from being formed to extend on the sensitive zone.

The sensitive zone and the dead zones are measured by the micro-track profile method described above with reference to FIG. 2. In the present invention, even when the insulating layers 31 are formed to extend to the upper surface of the multilayer film 35, the insulating layers 31 extend only on the dead zones, and thus the reproducing gap has a uniform length within the width dimension of the sensitive zone in the track width direction, causing no adverse effect on the reproducing characteristics.

Each of the tunneling magnetoresistive elements shown in FIGS. 5 to 8 comprises means for supplying a bias magnetic field to a free magnetic layer, which is different from the tunneling magnetoresistive elements shown in FIGS. 1 to 4 in.

Figure 5:
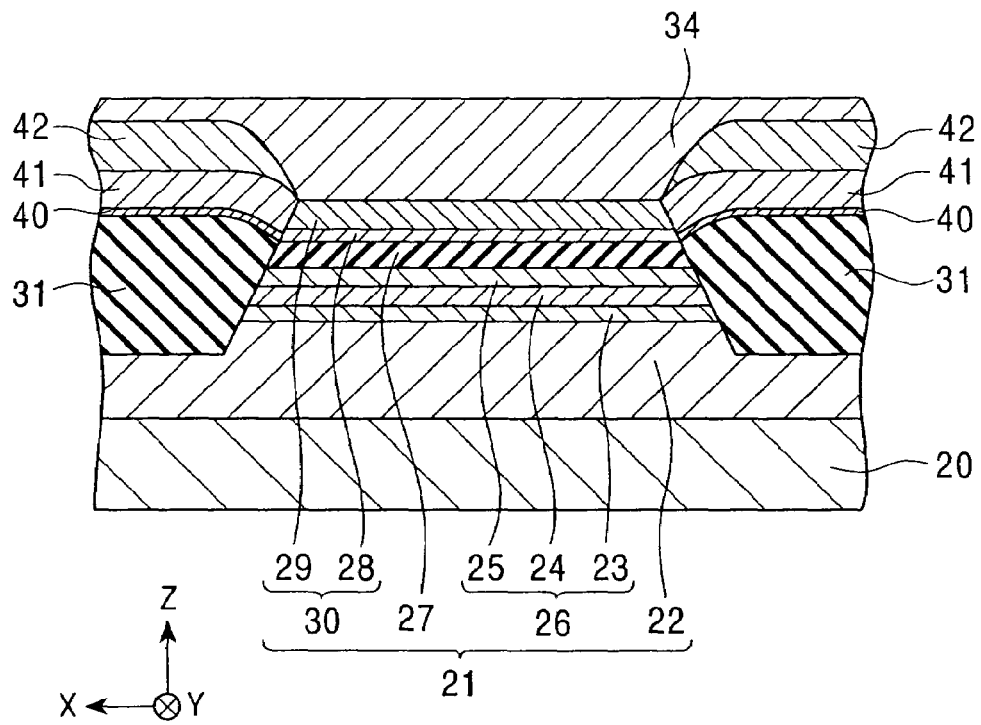
FIG. 5 is a partial sectional view showing the structure of a tunneling magnetoresistive element according to a still further embodiment of the present invention.
Figure 6:
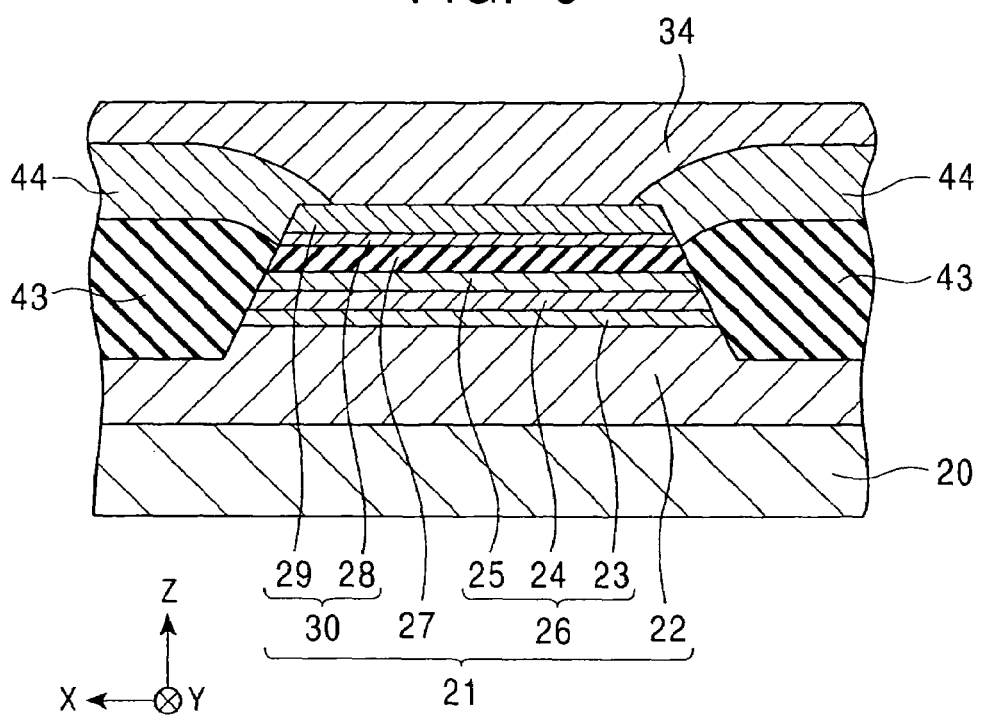
FIG. 6 is a partial sectional view showing the structure of a tunneling magnetoresistive element according to a further embodiment of the present invention.

Like in the structures shown in FIGS. 1 and 2, in the structures shown in FIGS. 5 and 6, a multilayer film 21 formed on an electrode layer 20 comprises an antiferromagnetic layer 22, a pinned magnetic layer 26, an insulating barrier layer 27 and a free magnetic layer 30, which are laminated in turn from the bottom. Furthermore, insulating layers 31 are formed on the antiferromagnetic layer 22 to be located on both sides of the multilayer film 21 in the track width direction (the X direction). A ferromagnetic layer 41 is formed on each of the insulating layers 31 through an underlying layer 40. As shown in FIG. 5, the ferromagnetic layers 41 are formed in contact with at least portions of both end surfaces of the free magnetic layer 30 in the track width direction.

A second antiferromagnetic layer 42 is formed on each of the ferromagnetic layers 41. In this embodiment, magnetization of each of the ferromagnetic layers 41 is pinned in the X direction by an exchange coupling magnetic field produced between the ferromagnetic layer 41 and the second antiferromagnetic layer 42, and a bias magnetic field is supplied to the end surfaces of the free magnetic layer 30 from the ferromagnetic layers 41 in the X direction to orient magnetization of the free magnetic layer 30 in the X direction.

The ferromagnetic layers 41 comprise the same material as the pinned magnetic layer 26 and the free magnetic layer 30, and the second antiferromagnetic layers 42 comprise the same material as the antiferromagnetic layer 22.

In FIG. 5, the ferromagnetic layers 41 and the second antiferromagnetic layers 42 are formed so as not to extend to the upper surface of the multilayer film 21. This can appropriately decrease instability of the reproduced waveform and Barkhausen noise without causing destabilization of the magnetic domain structure of the free magnetic layer 30.

The underlying layers 40 respectively provided below the ferromagnetic layers 41 are not necessarily formed. However, when the underlying layers 40 are used, the underlying layers 40 preferably comprises a film of Ta, Hf, Ti, Zr, or the like. The crystal orientation of the ferromagnetic layers 41 can be controlled by the underlying layer 40 to secure the predetermined exchange bias magnetic field. In this case, the free magnetic layer 30 and the ferromagnetic layers 41 are directly joined together by exchange interaction, and thus the depositing angle of the underlying layers 40 is preferably controlled to prevent interposition of the underlying layers 40 at the junction interfaces between the free magnetic layer 30 and the ferromagnetic layers 41.

In FIG. 5, the ferromagnetic layers 41 and the second antiferromagnetic layers 42 may be formed to extend on the dead zones of the multilayer film 21. Also, the second antiferromagnetic layers 42 may be formed below the ferromagnetic layers 41. Namely, the thickness of the insulating layers 31 is slightly decreased so that the second antiferromagnetic layers 42 and the ferromagnetic layers 41 are laminated on the insulating layers 31. In this case, the ratio of the conductive layers (the second antiferromagnetic layers 42 and the ferromagnetic layers 41) in direct contact with both sides of the multilayer film 21 is increased. Therefore, in order to decrease a shunt current of the sensing current into these layers, the second antiferromagnetic layers 42 are preferably made of an antiferromagnetic insulating material having antiferromagnetism, which will be described below.

In FIG. 6, antiferromagnetic layers 43 having antiferromagnetism are deposited on the antiferromagnetic layer 22 to be located on both sides of the multilayer film 21 in the track width direction (the X direction shown in the drawing), and ferromagnetic layers 44 are deposited on the antiferromagnetic layer 43.

The ferromagnetic layers 44 are formed in contact with at least portions of both end surfaces of the free magnetic layer 30 in the track width direction. Consequently, a bias magnetic field is supplied to the side surfaces of the free magnetic layer 30 from the ferromagnetic layers 44 to orient magnetization of the free magnetic layer 30 in the X direction.

As described above, the antiferromagnetic insulating layers 43 have antiferromagnetism. As the material of the antiferromagnetic insulating layers 43, a film of α-$Fe_2O_3$, NiO, NiCoO, or the like can be used. With the antiferromagnetic insulating layers 43 comprising a α-$Fe_2O_3$ film, exchange coupling magnetic fields are produced between the insulating layers 43 and the ferromagnetic layers 44 to appropriately pin magnetization of the ferromagnetic layers 44 in the X direction.

Furthermore, the antiferromagnetic insulating layers 43 have an insulating property, and thus exhibit the same function as the insulating layers 32 shown in FIGS. 1 to 5, thereby causing no shunt current of the sensing current from the electrode layers 20 and 34 to the antiferromagnetic insulating layers 43.

In comparison with the embodiment shown in FIG. 5, the embodiment shown in FIG. 5 has the need to laminate the four layers including the insulating layer 31, the underlying layer 40, the ferromagnetic layer 41 and the second antiferromagnetic layer 42 on either side of the multilayer film 21, while the embodiment shown in FIG. 6 requires the formation of only two layers including the antiferromagnetic insulating layer 43 and the ferromagnetic layer 44, thereby decreasing the thickness of the laminated film formed on either side of the multilayer film as well as the number of the manufacturing steps.

In the embodiment shown in FIG. 6, the ferromagnetic layers 44 are formed to extend on the dead zones of the multilayer film 21, but the ferromagnetic layers 44 may be formed so as not to extend on the multilayer film 21.

Figure 7:
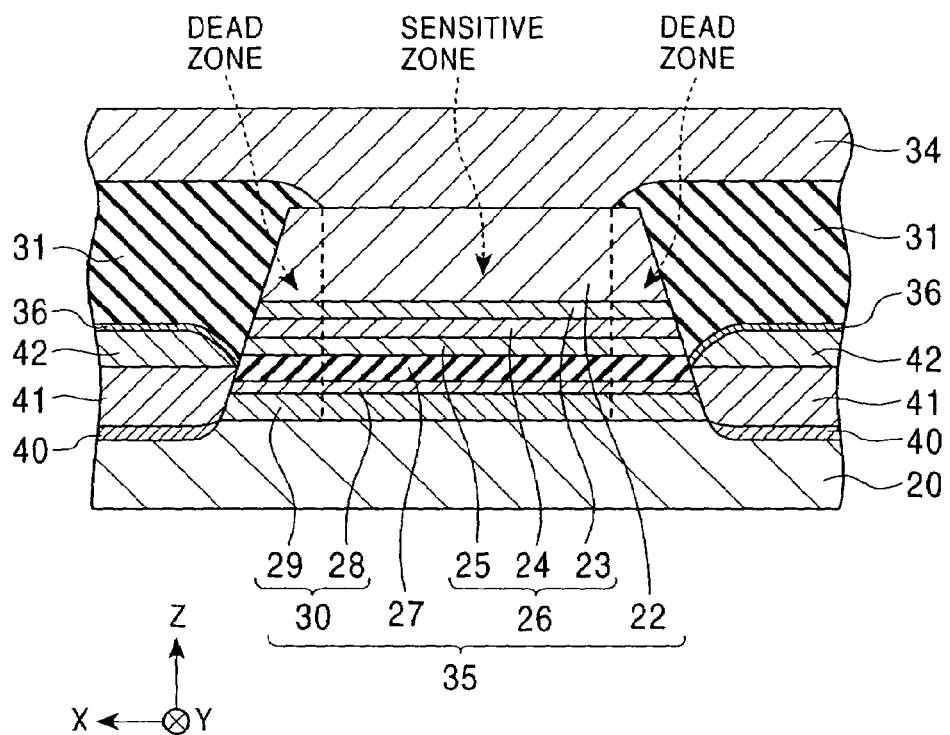
FIG. 7 is a partial sectional view showing the structure of a tunneling magnetoresistive element according to a further embodiment of the present invention.

In FIG. 7, a multilayer film 35 formed on an electrode layer 20 comprises a free magnetic layer 30, an insulating barrier layer 27, a pinned magnetic layer 26 and an antiferromagnetic layer 22, which are laminated in turn from the bottom.

Furthermore, underlying layers 40 each comprising a Ta film or the like are formed on the electrode layer 20 so as to be located on both sides of the multilayer film 35, and ferromagnetic layers 41 are formed on the underlying layers 40. The ferromagnetic layers 41 are formed in contact with at least portions of both end surfaces of the free magnetic layer 30 in the track width direction.

Second antiferromagnetic layers 42 are formed on the ferromagnetic layers 41, and insulating layers 31 are formed on the antiferromagnetic layers 42 through nonmagnetic intermediate layers 36 each comprising a Ta film or the like. Like in the embodiment shown in FIG. 5, exchange coupling magnetic fields are produced between the ferromagnetic layers 41 and the second antiferromagnetic layers 42 to pin magnetization of the ferromagnetic layers 41 in the X direction, and a bias magnetic field is applied to the end surfaces of the free magnetic layer 30 from the ferromagnetic layers 41 in the X direction to orient magnetization of the free magnetic layer 30 in the X direction shown in the drawing.

In the embodiment shown in FIG. 7, the insulating layers 31 are formed to extend on the dead zones of the mutilayer film 35, but the insulating layers 31 may be formed so as not to extend on the multilayer film 35.

Figure 8:
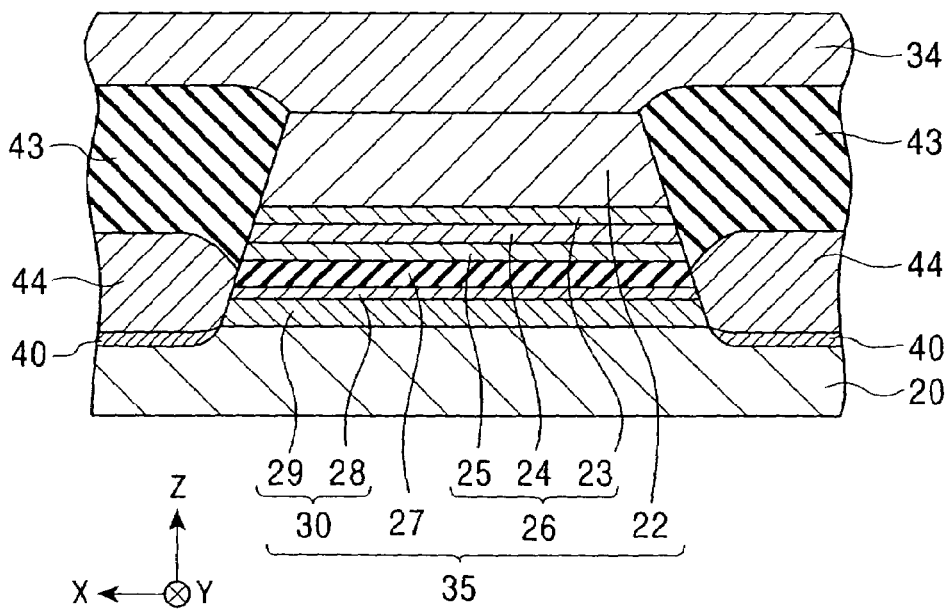
FIG. 8 is a partial sectional view showing the structure of a tunneling magnetoresistive element according to a further embodiment of the present invention.

In the embodiment shown in FIG. 8, underlying layer 40 composed of Ta or the like are formed on an electrode layer 20 to be located on both sides of the mulilayer film 35, and ferromagnetic layers 44 are formed on the underlying layers 40. The ferromagnetic layers 44 are formed in contact with at least portions of both end surfaces of the free magnetic layer 30 in the track width direction (the X direction shown in the drawing). Furthermore, antiferromagnetic insulating layers 43 having antiferromagnetism are formed on the ferromagnetic layers 44. Each of the antiferromagnetic insulating layers 43 comprises a film of α-$Fe_2O_3$, NiO, or the like.

Exchange coupling magnetic fields are produced between the ferromagnetic layers 44 and the antiferromagnetic layers 43 having antiferromagnetism to pin the magnetization of the ferromagnetic layers 44 in the X direction, and a bias magnetic field is supplied to the side end surfaces of the free magnetic layer 30 from the ferromagnetic layers 44 in the X direction to orient the magnetization of the free magnetic layer 30 in the X direction.

In this embodiment, the antiferromagnetic insulating layers 43 have the functions of both the insulating layers 31 and the second ferromagnetic layers 42 shown in FIG. 7, and thus the number of the layers can be decreased to decrease the thickness of the laminated film formed on either side of the multilayer film 35.

In the embodiment shown in FIG. 8, the antiferromagnetic insulating layers 43 are formed so as not to extend to the upper surface of the multilayer film 35, but the antiferromagnetic insulating layers 43 may be formed to extend on the dead zones of the multilayer film 35.

Each of the above-described tunneling magnetoresistive elements of the present invention can be used as a reproducing head which is provided in a hard disk device, as well as a memory device of MRAM or the like.

A reproducing head using any one of the above tunneling magnetoresistive elements may be a sliding type or a floating type, and a conventional type in which the element is exposed at the ABS, or a type such as a Yoke type, a Flux guide type, or the like, in which the element is recessed from the ABS.

In each of the embodiments shown in FIGS. 1 to 8, the pinned magnetic layer 26 comprises the three layers, and the free magnetic layer 30 comprises the two layers. However, like in a conventional element, these layers may comprise a single layer, or the free magnetic layer 30 may be formed in a ferrimagnetic state.

The method of manufacturing a tunneling magnetoresistive element of the present invention will be described below with reference to the drawings. The drawings of FIGS. 9 to 13 show a first example of the manufacturing method of the present invention.

Figure 9:
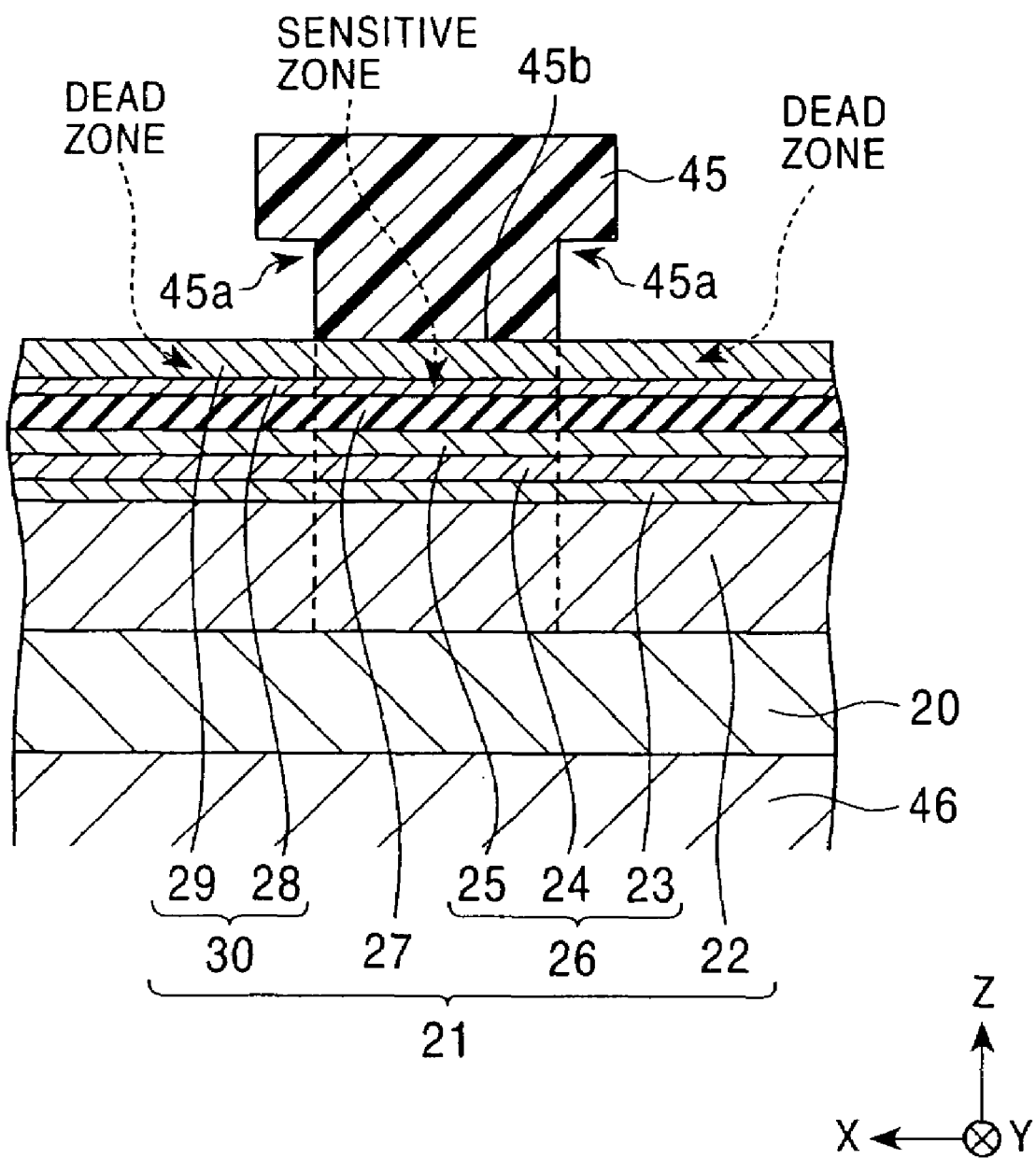
FIG. 9 is a drawing showing a step of a method of manufacturing a tunneling magnetoresistive element according to the present invention.

In the step shown in FIG. 9, an electrode layer 20, an antiferromagnetic layer 22, a pinned magnetic layer 26, an insulating barrier layer 27 and a free magnetic layer 30 are laminated on a substrate 46. The layers ranging from the antiferromagnetic layer 22 to the free magnetic layer 30 constitute a multilayer film 21. Also, a protecting layer of Ta may be provided on the free magnetic layer 30.

The pinned magnetic layer 26 comprises three films in a ferrimagnetic state. For example, each of ferromagnetic layers 23 and 25 comprises a Co film, and a nonmagnetic layer 24 comprises a Ru film. Furthermore, the free magnetic layer 30 comprises two films. For example, a layer 28 comprises a Co film, and a layer 29 comprises a NiFe alloy film.

The materials of the electrode layer 20, the antiferromagnetic layer 22 and the insulating barrier layer 27 are the same as those shown in FIG. 1.

As shown in FIG. 9, a lift-off resist layer 45 having notched portions 45a formed on the lower side thereof is formed on the free magnetic layer 30. In this step, the width dimension of the lower surface 45b of the resist layer 45 in the track width direction (the X direction shown in the drawing) is set to a value which is the same as or longer than the width dimension of the sensitive zone of the multilayer film 21. The sensitive zone and the dead zones are measured by the micro-track profile method to determine the width dimension of the sensitive zone in the track width direction (the X direction) before the step of forming the resist layer 45.

Figure 10:
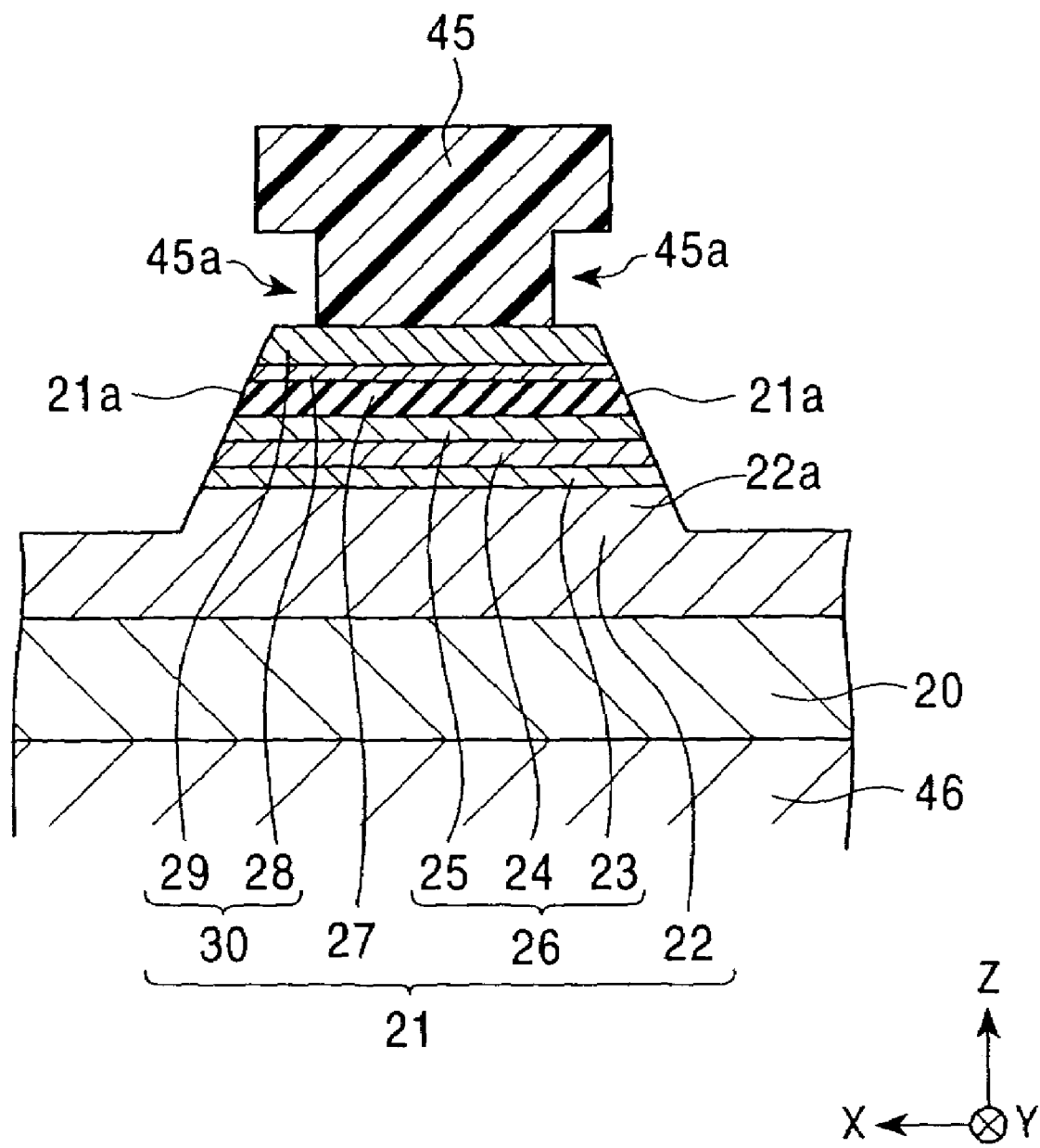
FIG. 10 is a drawing showing a step after the step shown in FIG. 9.

In the step shown in FIG. 10, both sides of the multilayer film 21 in the track width direction (the X direction) are removed by dry etching by ion milling or the like to leave at least the portion of the multilayer film 21 which is covered with the resist layer 45.

In this step, as shown in FIG. 10, the antiferromagnetic insulating layer 22 is etched out to an intermediate position to form a protrusion 22a of the antiferromagnetic layer 22, which protrudes near the center thereof. The multilayer film 21 is etched as described above to form inclined end surfaces 21a at both sides thereof in the track width direction so that the width dimension gradually increases toward the antiferromagnetic layer 22.

Figure 11:
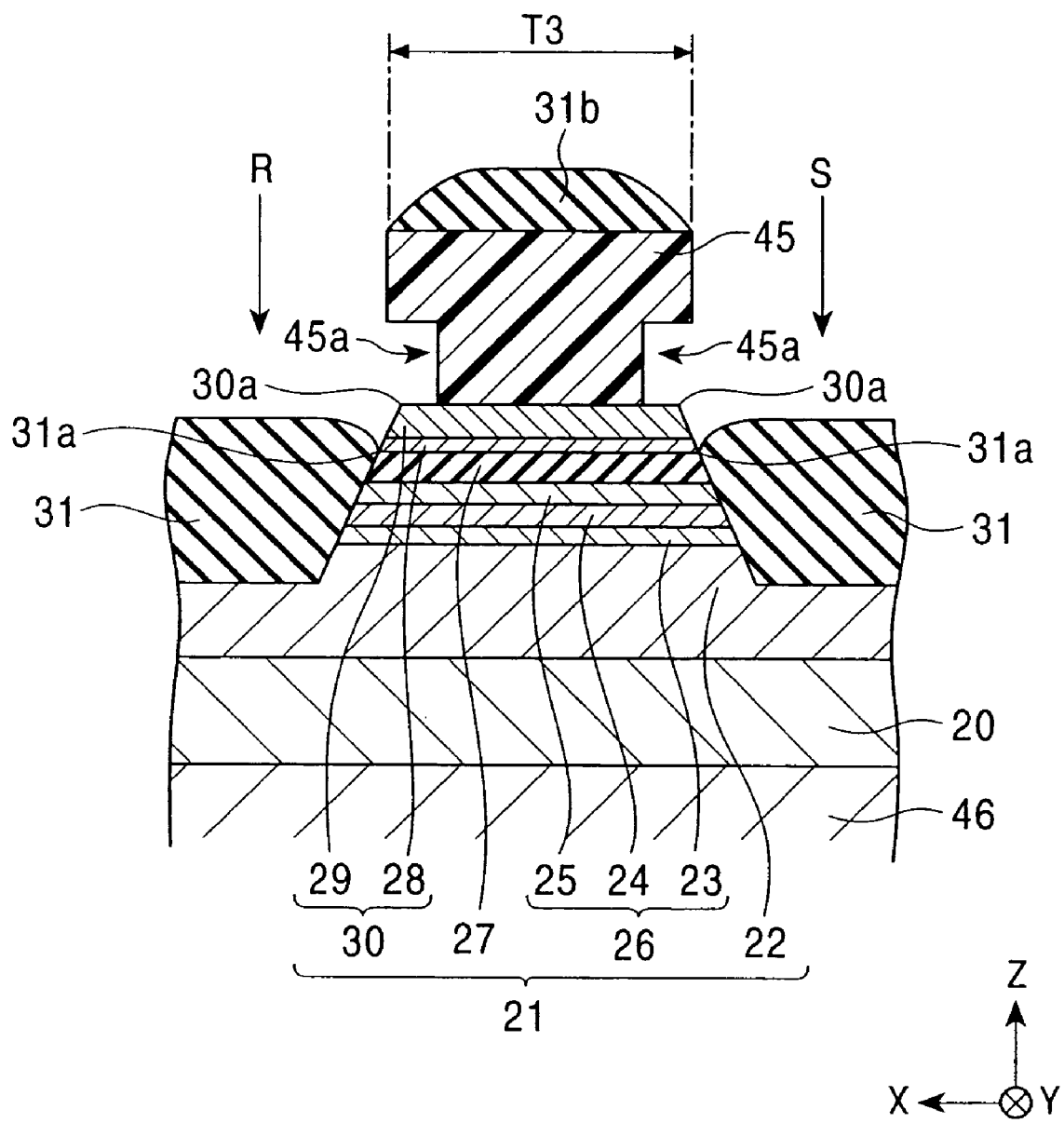
FIG. 11 is a drawing showing a step after the step shown in FIG. 10.

In the step shown in FIG. 11, the insulating layers 31 are formed on the antiferromagnetic layer 22 to be located on both sides of the multilayer film 21 in the track width direction. The insulating layers 31 are deposited by sputtering in the R and S directions shown in the drawing in a sputtering apparatus using a target opposite to the substrate 46 near parallel thereto. The sputtering apparatus preferably uses a means of ion beam sputtering, long stroke sputtering, collimation sputtering, or the like, in which sputtered particles have high linearity.

The R direction and S direction are preferably vertical or approximately vertical to the substrate 46. In this case, the insulating layers 31 are not formed on the portions of both end surfaces of the multilayer film 21, which are shaded by the resist layer 45 when the multilayer film 21 is viewed from above.

Namely, the forming position and the thickness of the insulating layers 31 formed on both side surfaces of the multilayer film 21 can be changed by appropriately controlling the maximum width dimension T3 of the resist layer 45 in the track width direction and the sputtering time for the target.

In the present invention, bias layers 33 formed on the insulating layers 31 must be formed in contact with at least portions of both end surfaces of the free magnetic layer 30 in the track width direction.

In order to achieve the above construction, the insulating layers 31 must be deposited so that the multilayer film-side ends 31a of the upper surfaces of the insulating layers 31 are lower than the ends 30a of the upper surface of the free magnetic layer 30.

Therefore, the maximum width dimension T3 of the resist layer 45 in the track width direction may be set to a value which is the same as or slightly shorter than the width dimension of the lower surface (i.e., the lower surface of the layer 28 shown in FIG. 11) of the free magnetic layer 30, or the maximum width dimension T3 may be set to be longer than the width dimension of the free magnetic layer 30 so that at least the free magnetic layer 30 is not completely seen when the multilayer film 21 is viewed from above (a portion of the free magnetic layer 30 may be seen).

The resist layer 45 having the maximum width dimension T3 appropriately controlled as described above is formed on the free magnetic layer 30, and the insulating layers 31 are formed on both end surfaces of the multilayer film 21 in the track width direction. In this case, both end surfaces of the multilayer film 21 are not completely covered with the free magnetic layer 30 to create a state in which at least portions of both end surfaces of the free magnetic layer 30 are exposed after the formation of the insulating layer 31.

In this step, an insulating material layer 31b of the same material as the insulating layer 31 is formed on the resist layer 45.

Figure 12:
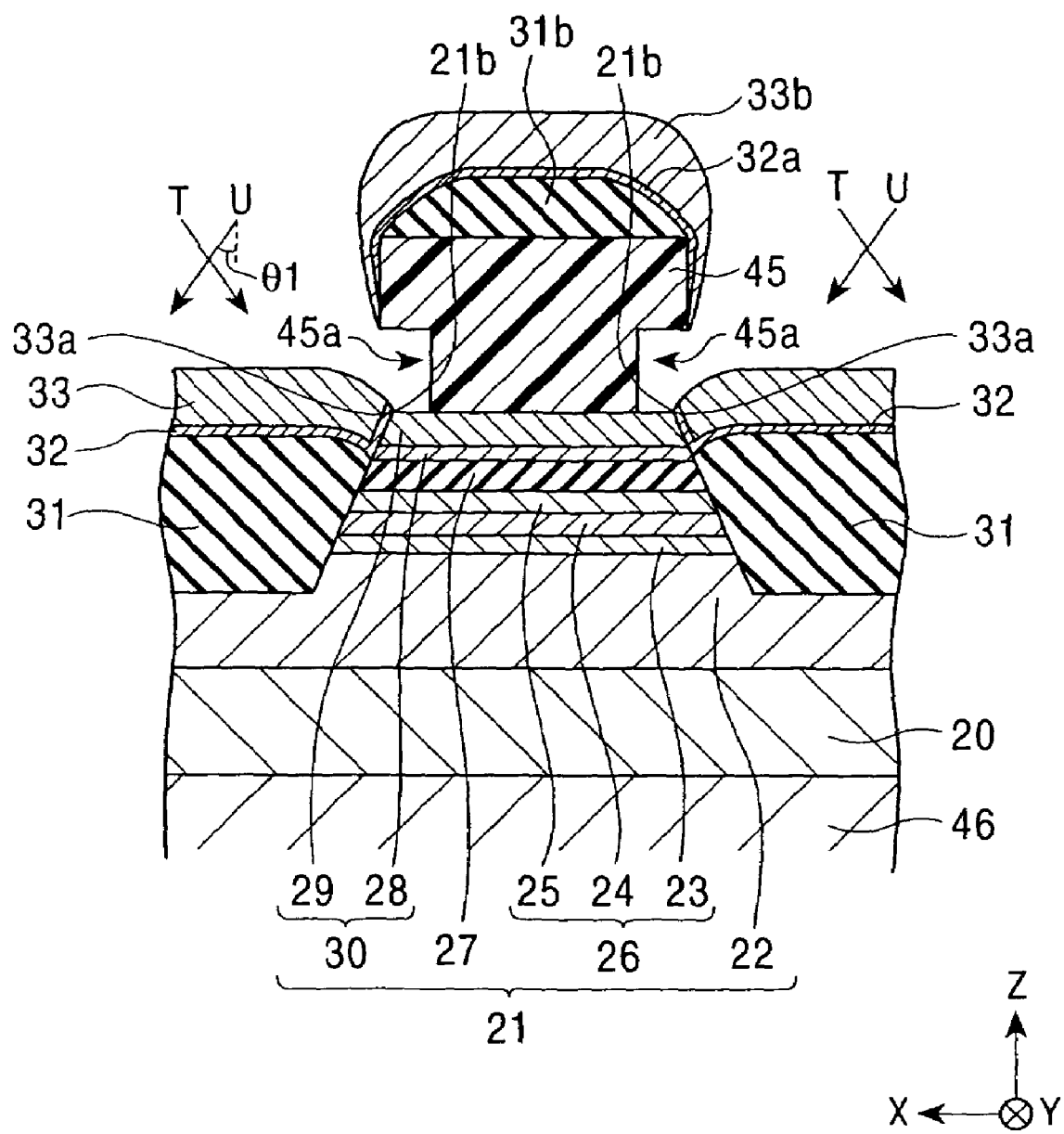
FIG. 12 is a drawing showing a step after the step shown in FIG. 11.

In the next step shown in FIG. 12, underlying layers 32 and bias layers 33 are deposited by sputtering obliquely to the substrate 46.

In order to perform sputtering obliquely, the substrate 46 is inclined relative to the target, or the target is inclined relative to the substrate 46. As shown in FIG. 12, the sputtering direction is preferably the directions T and U with an inclination θ1 relative to the vertical direction of the substrate 46, the inclination θ1 being preferably 20 to 50°.

By the oblique sputtering, the bias layers 33 are appropriately deposited on both end surfaces of the free magnetic layer 30 in the track width direction (the X direction) which are shaded by the resist layer 45 when the multilayer film 21 is viewed from above.

As described above, at least portions of both end surfaces of the free magnetic layer 30 are exposed in the step in which the insulating layers 31 are deposited on both end surfaces of the multilayer film 21, and thus the bias layers 33 can be formed in contact with the exposed portions of both end surfaces of the free magnetic layer 30. Therefore, a bias magnetic field can be appropriately supplied to the free magnetic layer 30 from the bias layers 33.

In this step, the formation position of the bias layers 33, particularly, the multilayer film-side end positions thereof, can be changed by appropriately controlling the sputtering directions T and U in deposition of the underlying layers 32 and the bias layers 33.

In the step shown in FIG. 12, the sputtering directions T and U and the sputtering time are appropriately controlled so that the multilayer film-side ends of the upper surfaces of the bias layers 33 coincide with both ends of the upper surface of the multilayer film 21.

The underlying layers 32 and the bias layers 33 formed in this step do not extend to the upper surface of the multilayer film 21, as shown in FIG. 12.

In depositing the underlying layers 32 and the bias layers 33 by sputtering, an underlying material film 32a and a bias material layer 33b comprising the same materials as the underlying layers 32 and the bias layers 33, respectively, on the insulating material layer 31b on the resist layer 45.

Next, the resist layer 45 is separated from the multilayer film 21. Since the resist layer 45 has the notched portions 45a formed on the lower side thereof, the resist layer 45 can easily be removed by permeating a separating solution from the notched portions 45a.

Figure 13:
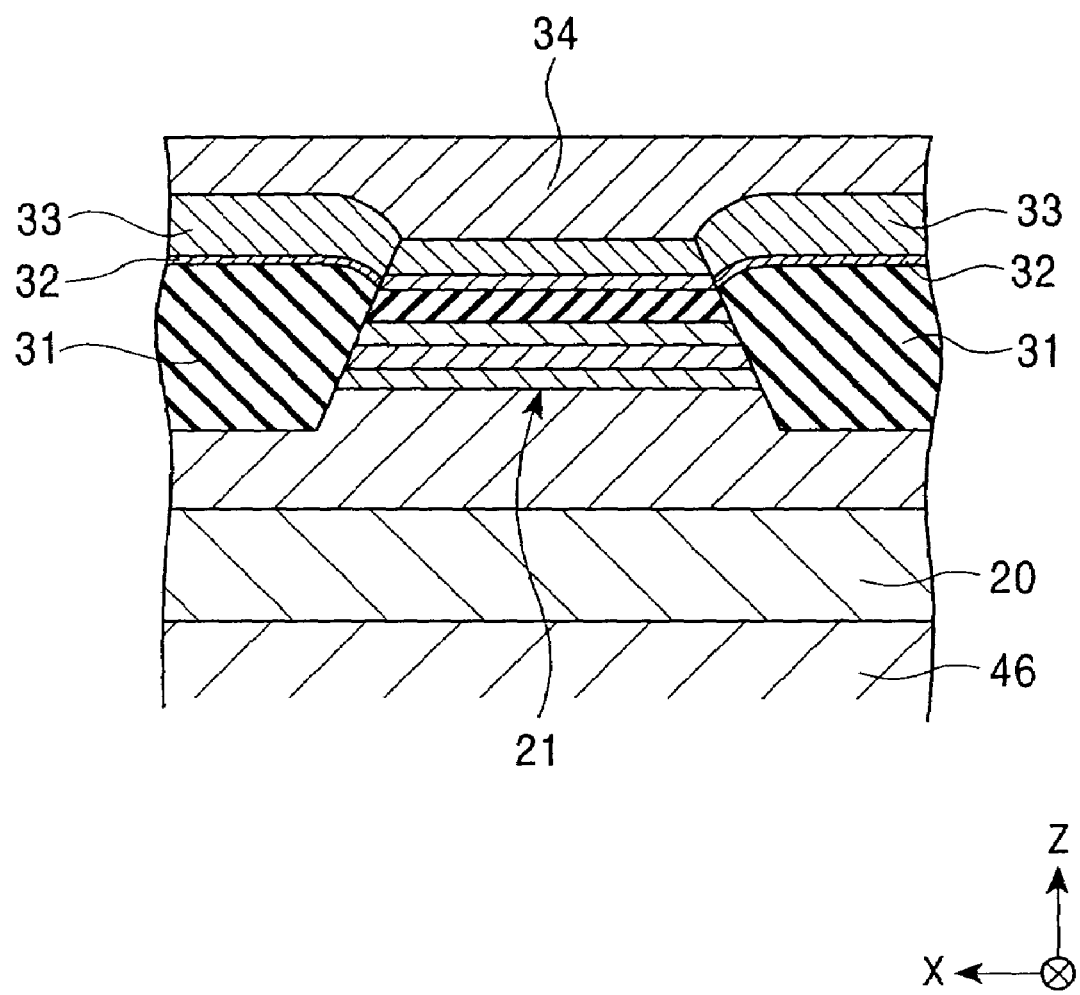
FIG. 13 is a drawing showing a step after the step shown in FIG. 12.

As shown in FIG. 13, an electrode layer 34 is formed on the multilayer film 21 and the bias layers 33.

In the step shown in FIG. 12, by changing the sputtering directions T and U, and the sputtering time, the underlying layers 32 and the bias layers 33 can be deposited by sputtering inside the notches portions 45a formed in the resist layer 45. This step is shown in FIG. 14.

Figure 14:
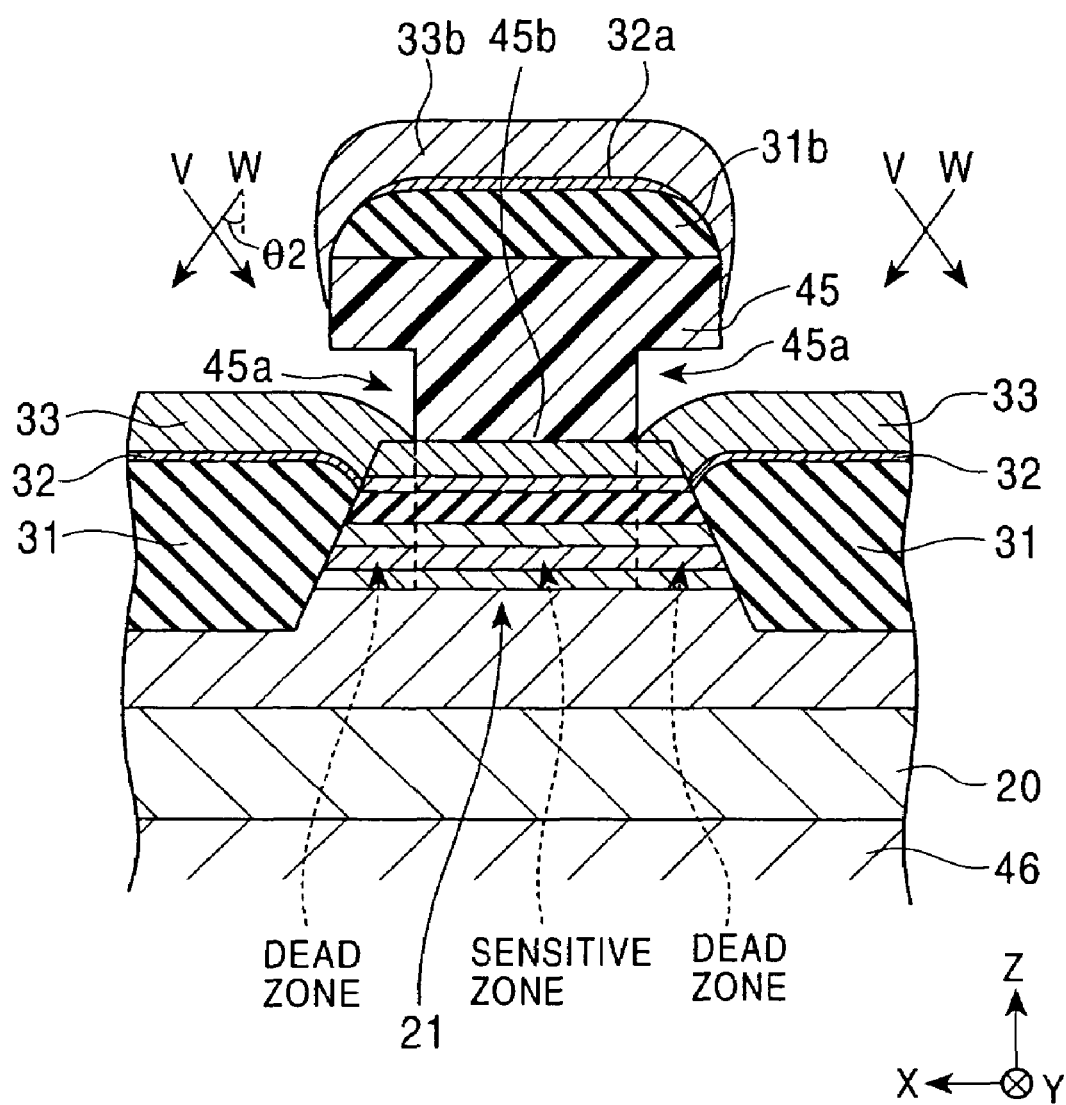
FIG. 14 is a drawing showing a step substituted for the step shown in FIG. 12.

As shown in FIG. 14, the sputtering directions V and W for the substrate 46 have an inclination θ2 relative to the vertical direction of the substrate 46, the inclination θ2 being in the range of 30 to 60'. The inclination θ2 is slightly larger than the inclination θ1 in sputtering in the step shown in FIG. 12 in which the multilayer film-side ends of the upper surface of the bias layer 33 coincide with both ends 21b of the upper surface of the multilayer film 21. This enables the sputtering deposition of the underlying layers 32 and the bias layers 33 inside of the notched portions 45a of the resist layer 45.

As shown in FIG. 14, the underlying layers 32 and the bias layers 33 are formed to extend to the upper surface of the multilayer film 21. However, as described above with respect to the step shown in FIG. 9, the resist layer 45 is formed on the multilayer film 21 so that the width dimension of the lower side 45b of the resist layer 45 coincides with at least the width dimension of the top of the sensitive zone of the multilayer film, and thus the underlying layers 32 and the bias layers 33 extended to the upper surface of the multilayer film 21 are formed only on the dead zones of the multilayer film 21, not formed on the sensitive zone thereof. The ratio of the width dimension T2 of the extension of each of the bias layers 33 on the multilayer film 21 to the width dimension of the upper surface of the multilayer film 21 is preferably 0%<(width dimension T2/width dimension of the upper surface of the multilayer 21)≦10%. Specifically, the width dimension T2 is preferably 0 nm<T2≦30 nm.

FIGS. 15 to 19 are drawings showing the steps of another example of the method of manufacturing a tunneling magnetoresistive element of the present invention.

Figure 15:
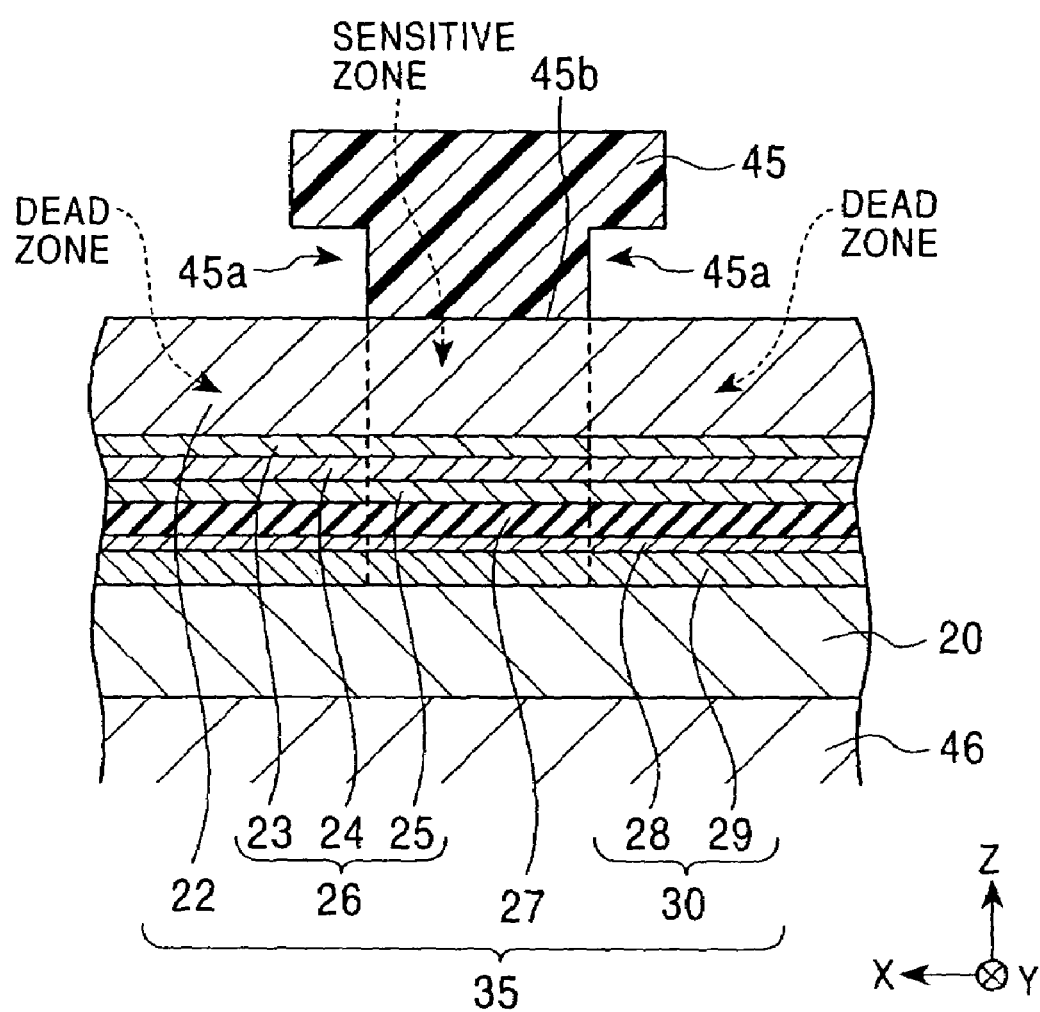
FIG. 15 is a drawing showing a step of a method of manufacturing another tunneling magnetoresistive element according to the present invention.

As shown in FIG. 15, an electrode layer 20 is formed on a substrate 46, and a multilayer film 35 is formed on the electrode layer 20 by sputtering. The multilayer film 35 comprises a free magnetic layer 30, an insulating barrier layer 27, a pinned magnetic layer 26 and an antiferromagnetic layer 22, which are laminated in turn from the bottom. The free magnetic layer 30 comprises two layers 28 and 29, and the pinned magnetic layer 26 comprises three layers including ferromagnetic layers 23 and 25, and a nonmagnetic layer 24 and is put into a ferrimagnetic state. An underlying layer of Ta or the like may be formed below the free magnetic layer 30, and a protecting layer of Ta or the like is preferably formed on the antiferromagnetic layer 22.

The sensitive zone of the multilayer film 35 has previously been measured by the micro-track profile method.

As shown in FIG. 15, a resist layer 45 having notched portions 45a formed on the lower side thereof is formed on the multilayer film 35. In this step, the width dimension of the lower surface 45b of the resist layer 45 in the track width direction is set a value which is the same as or longer than the width dimension of the sensitive zone of the multilayer film 35 in the track width direction so that the sensitive zone is completely covered with the lower surface 45b of the resist layer 45.

Figure 16:
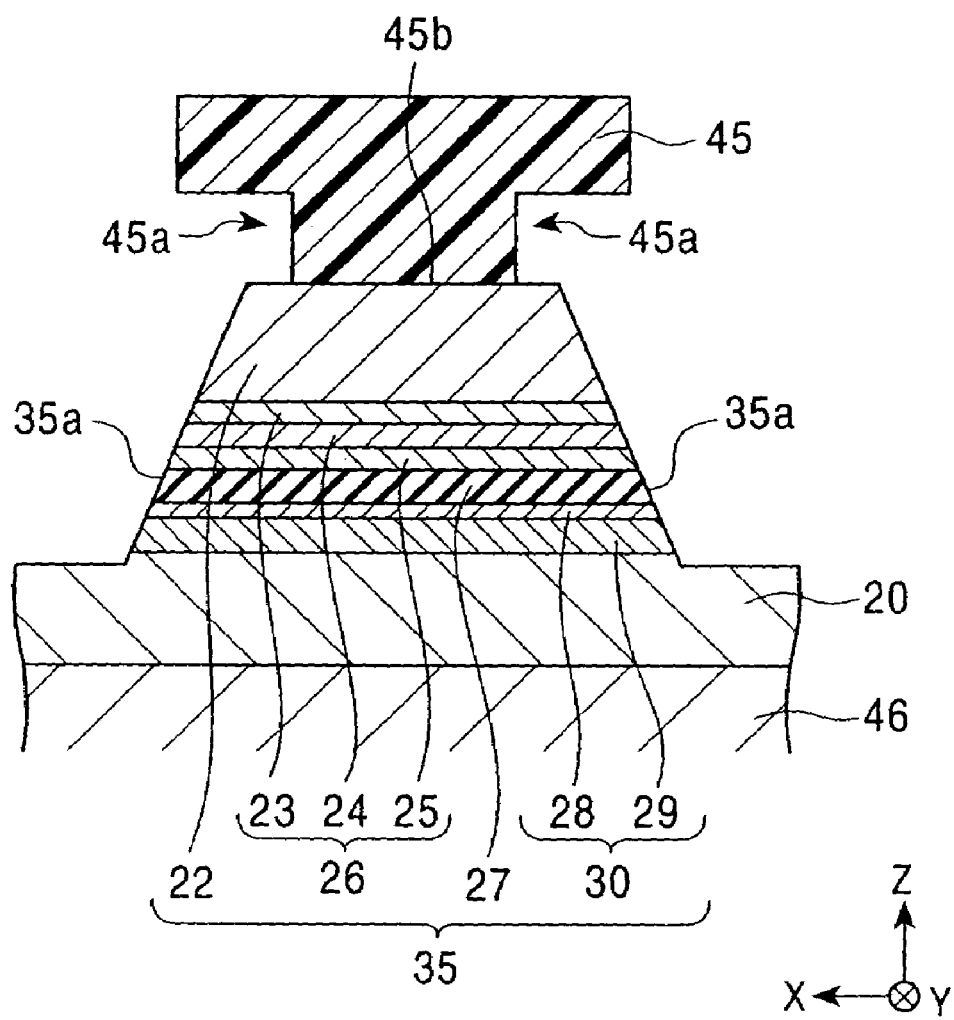
FIG. 16 is a drawing showing a step after the step shown in FIG. 15.

In the next step shown in FIG. 16, both side portions of the multilayer film 35 are removed by dry etching by ion milling to leave at least the portion of the multilayer film 35, which is covered with the resist layer 45, exposing the electrode layers in the removed portions. The upper surface of the electrode layer 20 is also slightly removed by etching.

The dimension of the upper surface of the multilayer film 35 left after etching is longer than the width dimension of the lower surface 45b of the resist layer 45, and thus the upper surface of the multilayer film 35 extends from the lower surface 45b in the track width direction. By this etching, both end surfaces 35a of the multilayer film 35 are inclined so that the width dimension in the track width direction gradually increases toward the free magnetic layer 30.

Figure 17:
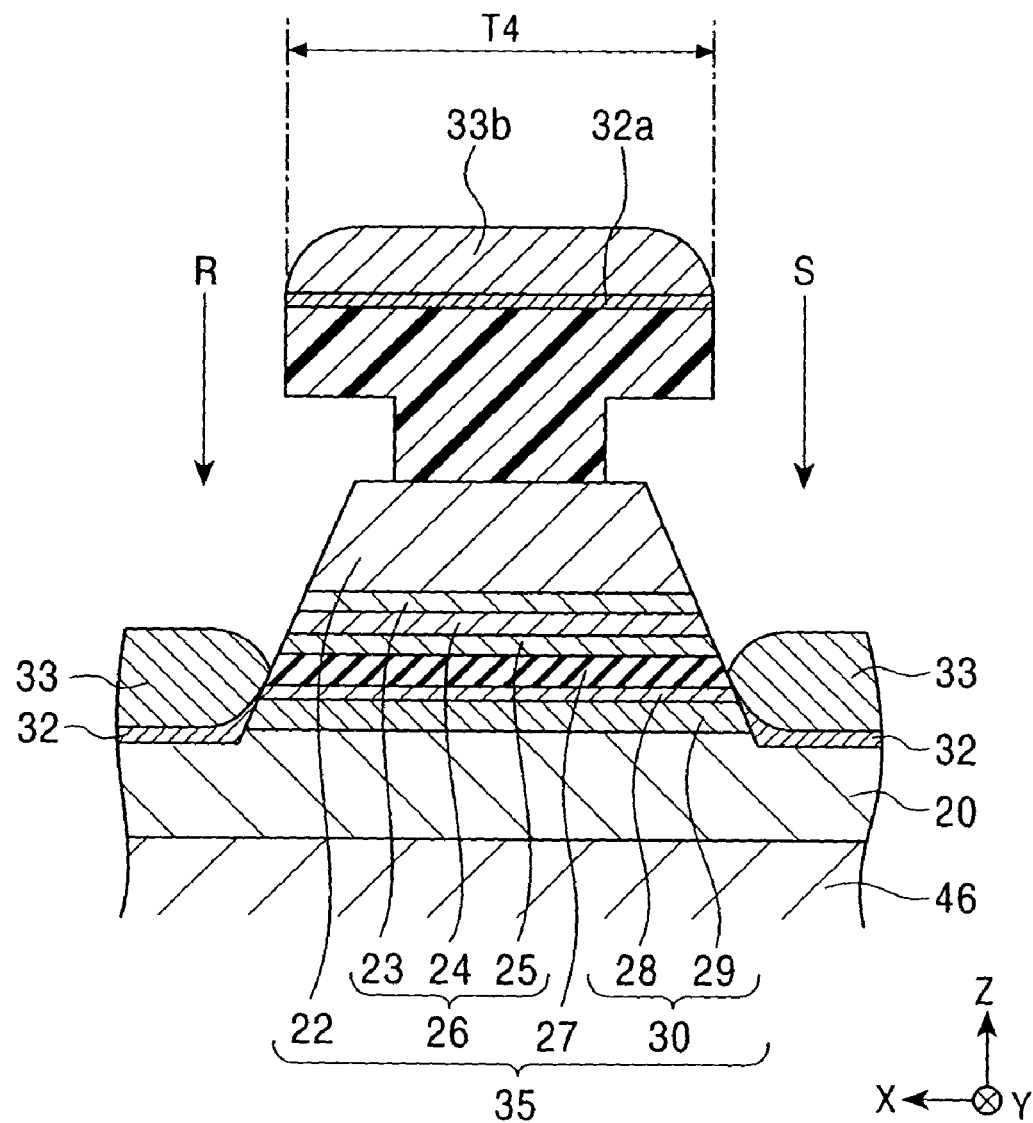
FIG. 17 is a drawing showing a step after the step shown in FIG. 16.

In the step shown in FIG. 17, underlying layers 32 composed of Cr or the like are deposited on the portions of electrode layer 20 exposed on both sides of the multilayer film 35 by sputtering in the sputtering directions R and S which are vertical or approximately vertical to the substrate 46. Furthermore, bias layers 33 are deposited on the underlying layers 32 by sputtering.

In the step shown in FIG. 17, it is necessary to take consideration reverse to the step shown in FIG. 11. Namely, in the step shown in FIG. 17, the maximum width dimension T4 of the resist layer 45 in the track width direction may be set to a value which is the same as or slightly longer or shorter than the width dimension of the upper surface (i.e., the upper surface of the layer 28 shown in FIG. 17) of the free magnetic layer 30 in the track width direction. Therefore, at least portions of both end surfaces of the free magnetic layer 30 are seen when the multilayer film 35 is viewed from above.

In depositing the bias layers 33 on both side surfaces of the multilayer film 35 by sputtering, the bias layers 33 are formed in contact with at least portions of both side surfaces of the free magnetic layer 30, whereby a bias magnetic field can be appropriately supplied to the side surfaces of the free magnetic layer 30 from the bias layers 30 in the track width direction.

As shown in FIG. 17, an underlying material layer 32a and a bias material layer 33b are deposited on the resist layer 45.

After the bias layers 33 are deposited, nonmagnetic intermediate layers 36 are deposited on the bias layers 33.

Figure 18:
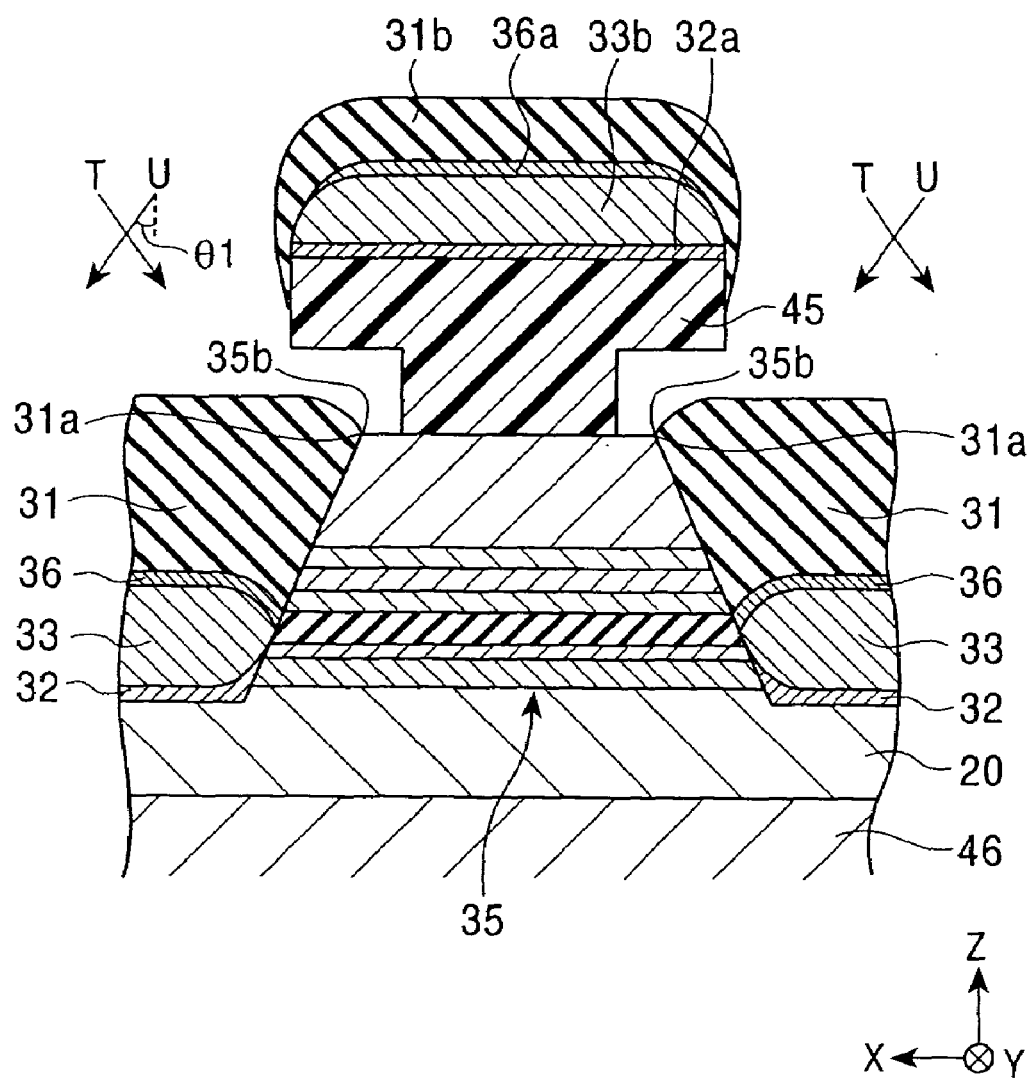
FIG. 18 is a drawing showing a step after the step shown in FIG. 17.

In the next step shown in FIG. 18, insulating layers 31 are deposited by sputtering on the bias layers 33 with the nonmagnetic intermediate layers 36 provided therebetween so as to be located on both sides of the multilayer film 35 in the track width direction (the X direction shown in the drawing). The insulating layers 31 are deposited by sputtering obliquely to the substrate 46.

The sputtering directions T and U have an inclination θ1 relative to the vertical direction of the substrate 46, the inclination θ1 being in the range of 20 to 50°.

In the step shown in FIG. 18, by appropriately controlling the sputtering directions T and U, the sputtering time, etc., the multilayer film-side ends 31a of the upper surfaces of the insulating layers 31 formed on the bias layers 33 can be cause to coincide with the both ends 35b of the upper surface of the multilayer film 35. Namely, in this step, the insulating layers 31 are formed so as not to extend to the upper surface of the multilayer film 35. Also, a nonmagnetic intermediate material layer 36a and a insulating material layer 31b are deposited on the resist layer 45.

The resist layer 45 shown in FIG. 18 is separated by permeating a separating solution from the notched portions 45a.

Figure 19:
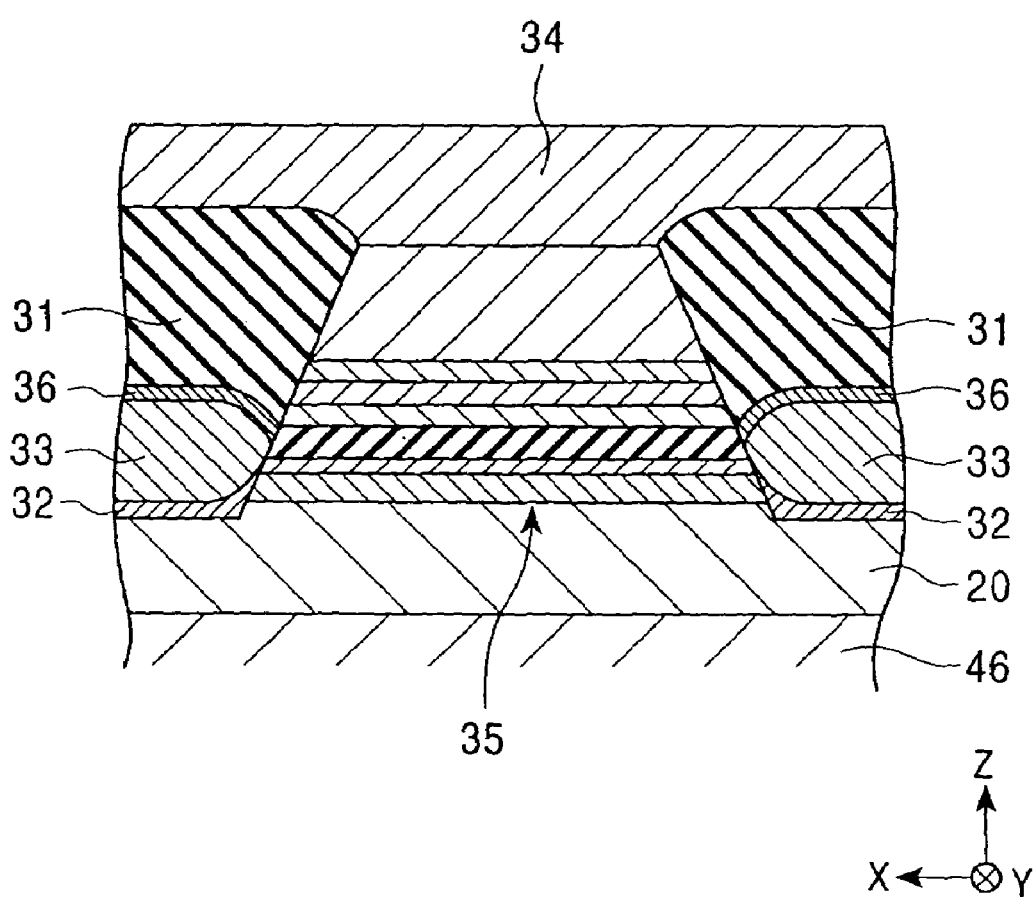
FIG. 19 is a drawing showing a step after the step shown in FIG. 18.

In the step shown in FIG. 19, an electrode layer 34 is formed on the multilayer film 35 and the insulating layers 31.

Figure 20:
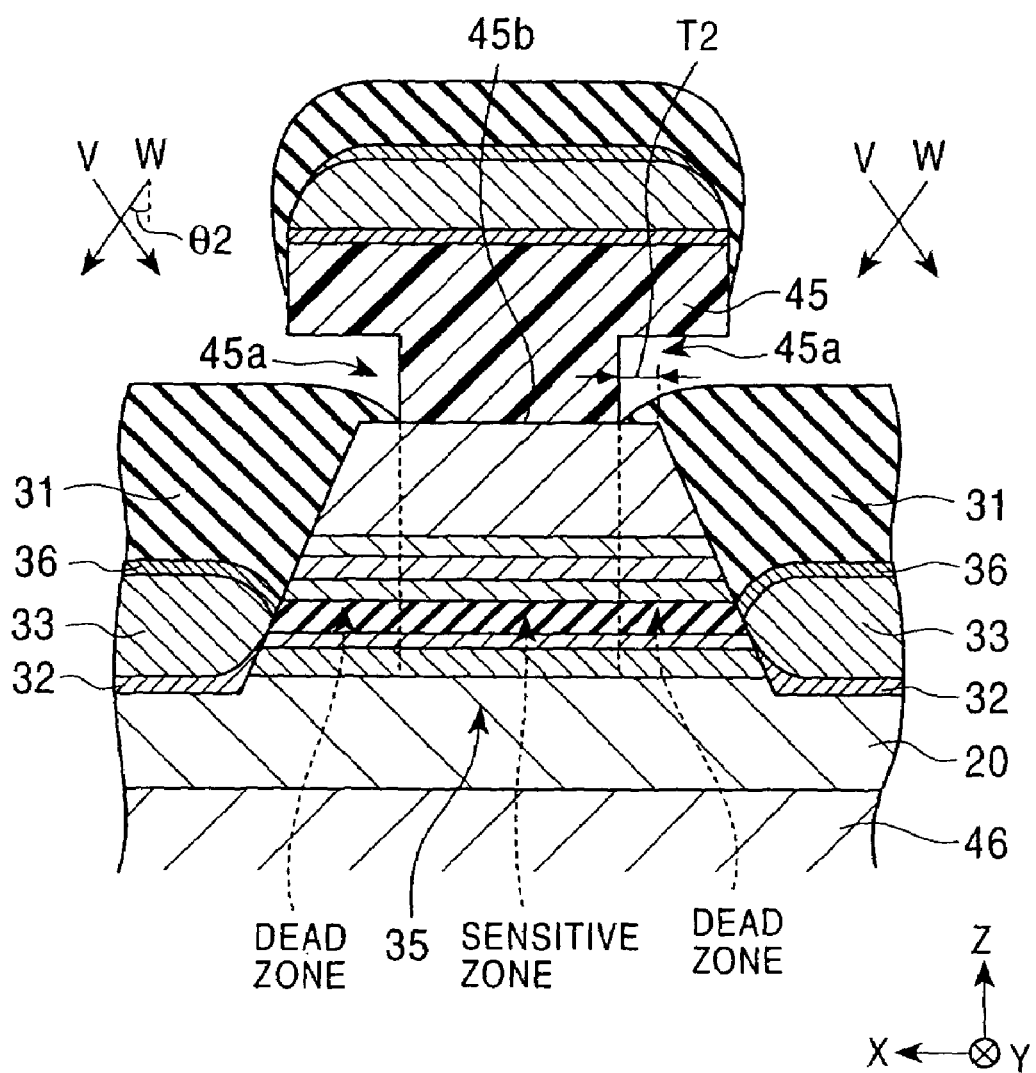
FIG. 20 is a drawing showing a step substituted for the step shown in FIG. 18.
Figure 21:
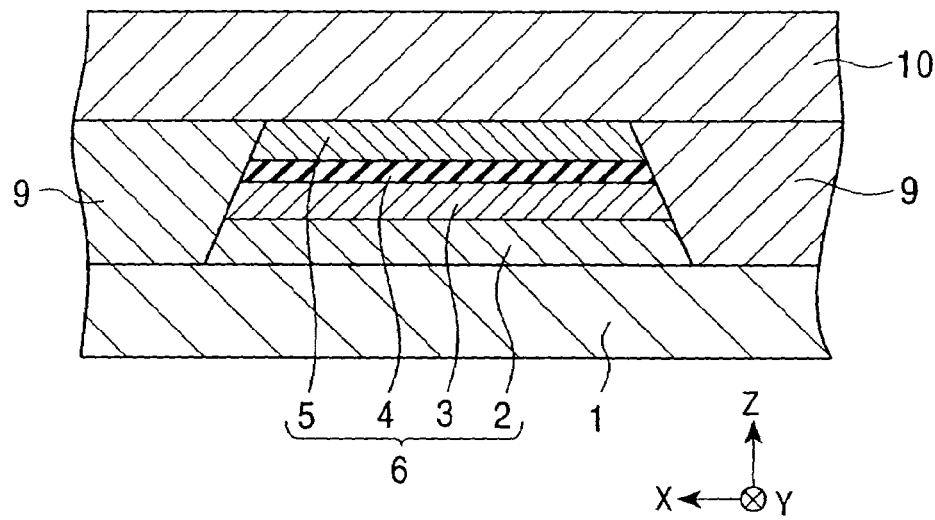
FIG. 21 is a partial schematic view showing the structure of a conventional tunneling magnetoresistive element.

FIG. 20 shows the step substituted for the step shown in FIG. 18. In the step shown in FIG. 20, the insulating layers 31 are formed inside the notched portions 45b of the resist layer 45 so as to extend to the upper surface of the multilayer film 35.

In forming the insulating layers 31 in this step, the sputtering directions V and W have an inclination θ2 relative to the vertical direction of the substrate, the inclination θ2 being in the range of 30 to 60°. The inclination θ2 is slightly larger than the inclination θ1 in sputtering in the step shown in FIG. 18 in which the multilayer film-side ends 31a of the upper surfaces of the insulating layers 31 coincide with both ends 35b of the upper surface of the multilayer film 35. This enables the sputtering deposition of the insulating layers 31 inside of the notched portions 45a of the resist layer 45.

In the step shown in FIG. 20, the insulating layers 31 formed to extend to the upper surface of the multilayer film 35 are formed on the dead zones of the multilayer film 35 outside the sensitive zone thereof which is covered with the lower surface 45b of the resist layer 45. The ratio of the width dimension T2 of the extension of each of the insulating layers 31 on the multilayer film 35 to the width dimension of the upper surface of the multilayer film 35 is preferably 0%<(width dimension T2/width dimension of the upper surface of the multilayer 35)≦10%. Specifically, the width dimension T2 is preferably 0 nm<T2≦30 nm.

Each of the tunneling magnetoresistive elements shown in FIGS. 5 to 8 can be manufactured by any of the above-described methods.

As shown in FIG. 5 or 7, in depositing the ferromagnetic layers 41 and the second antiferromagnetic layers 42 instead of the bias layers 33, the ferromagnetic layers 41 and the second antiferromagnetic layers 42 may be deposited by sputtering in the step of depositing the bias layers 33 (FIGS. 12, 14 and 17).

As shown in FIG. 6 or 8, in depositing the antiferromagnetic insulating layers 43 and the ferromagnetic layers 44 on both sides of the multilayer film, the antiferromagnetic layers 43 may be deposited instead of the insulating layers 31 in the step shown in FIG. 11, 19 or 20, and the ferromagnetic layers 44 may be deposited instead of the bias layers 33 in the step shown in FIG. 12, 14 or 17.

The above-described manufacturing method of the present invention can easily form a tunneling magnetoresistive element with high reproducibility, as compared with a conventional method.

Figure 24:
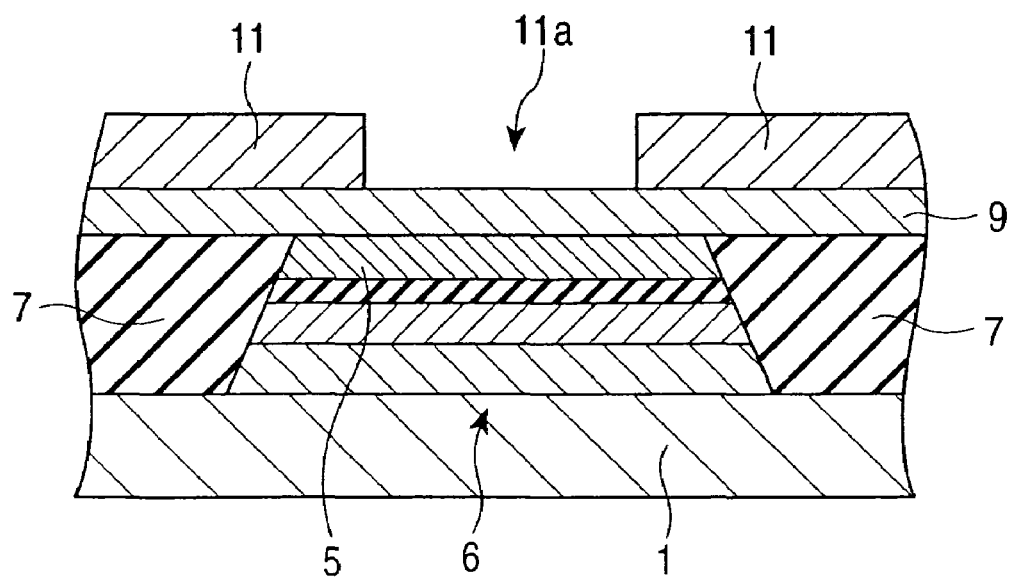
FIG. 24 is a drawing showing a step after the step shown in FIG. 23.

Namely, in the present invention, bias layers and insulating layers can be deposited on both sides of a multilayer film by using a lift-off resist layer. Therefore, unlike a conventional manufacturing method (refer to FIG. 24), the present invention does not require alignment precision and can thus form an element with high reproducibility. Although a conventional method requires an etching step for forming the bias layers and thus has fear of cutting a free magnetic layer in the etching step, the present invention does not require the etching step for forming the bias layers and the insulating layers, thereby protecting the free magnetic layer and causing no fear of deterioration in characteristics. In the present invention, by changing the angle formed by a target and a substrate in a sputtering apparatus, the bias layers and the insulating layers can be formed in predetermined shapes at predetermined positions on both sides of the multilayer film. Even when the bias layers or the insulating layers are formed to extend to the upper surface of the mutlilayer film, these layers are formed only on the dead zones of the multilayer film, thereby causing no need to consider the degree of extension of the bias layers or the insulating layers. Therefore, the manufacturing method can be simplified and shortened.

As described above, in the present invention, the bias layers are formed on both sides of the multilayer film so as to contact portions of both end surfaces of the free magnetic layer, and the insulating layers are also formed on both sides of the multilayer film. The bias layers or the insulating layers are formed so as not to extend to the upper surface of the multilayer film.

In the above-described construction, a sensing current from an electrode layer appropriately flows through the multilayer film, and a bias magnetic field can be supplied to the free magnetic layer from the bias layers through both end surfaces. Furthermore, since the bias layers or the insulating layers are formed so as not to extend to the upper surface of the multilayer film, the magnetic domain structure of the free magnetic layer can be stabilized to permit an attempt to decrease instability of the reproduced waveform and Barkhausen noise. Also, the thickness of the reproducing gap within the width dimension of the multilayer film in the track width direction can be made uniform.

Furthermore, in the present invention, the bias layers or the insulating layers may be formed to extend on the dead zones of the multilayer film. Namely, the bias layer or the insulating layersare formed so as not to exstend on the sensitive zone wich can exhibit the magnetoresistive effect, thereby causing no fear of deterioration in characteristics.

The method of manufacturing a tunneling magnetoresistive element of the present invention can easily form a magnetic element with high reproducibility.

What is claimed is:

1. A method of manufacturing a tunneling magnetoresistive element comprising:

(a) the step of forming an electrode layer on a substrate, and then laminating first antiferromagnetic layer, a pinned magnetic layer in which magnetization is pinned in a predetermined direction by an exchange coupling magnetic field with the antiferromagnetic layer, an insulating barrier layer, and a free magnetic layer in turn from the bottom to form a multilayer film;

(b) the step of forming, on the multilayer film, a lift-off resist layer having a notched portion formed on the lower side thereof;

(c) the step of removing both sides of the multilayer film leaving at least a portion of the multilayer film below the resist layer;

(d) the step of forming insulating layers, which cover side faces of the insulating barrier layer, on both sides of the multilayer film so that the multilayer film-side ends of the upper surfaces of the insulating layers are lower than both ends of an upper surface of the free magnetic layer;

(e) the step of forming domain control layers on the insulating layers by sputtering obliquely to the substrate so that the domain control layers contact both ends of the free magnetic layer, and the multilayer film-side ends of the domain control layers coincide with both ends of a top of the multilayer film, wherein each of the domain control layers comprises a Co—Pt alloy film or a Co—Cr—Pt alloy film, wherein underlying layers are formed below each of the domain control layers, that controls crystal orientation of the domain control layers, and wherein each of the underlying layers comprises a bcc-Fe film or a Fe—Co alloy film, each of the underlying layers is disposed between each side face of the free magnetic layer and each of the domain control layers, and each of the underlying layers is in direct contact with the free magnetic layer and each of the domain control layers; and (f) the step of removing the resist layer, and forming an electrode layer on the multilayer film and the domain control layers.

2. The method of manufacturing a tunneling magnetoresistive element according to claim 1, wherein in the step (d), the insulating layers are formed by sputtering vertically to the substrate.

3. The method of manufacturing a tunneling magnetoresistive element according to claim 2, wherein in the step (d), the insulating layers are formed by ion beam sputtering, long stroke sputtering, or collimation sputtering.

4. The method of manufacturing a tunneling magnetoresistive element according to claim 1, wherein each of the domain control layers comprises a hard magnetic material.

5. The method of manufacturing a tunneling magnetoresistive element according to claim 1, wherein each of the domain control layers comprises a laminated film of a ferromagnetic layer and a second antiferromagnetic layer, the ferromagnetic layers being in contact with at least portions of both side surfaces of the free magnetic layer.

6. The method of manufacturing a tunneling magnetoresistive element according to claim 5, wherein the second antiferromagnetic layer is made of $\alpha\text{-Fe}_2\text{O}_3$.

7. The method of manufacturing a tunneling magnetoresistive element according to claim 1, wherein each of the insulating layers comprises an antiferromagnetic insulating layer exhibiting an antiferromagnetic property, and each of the domain control layers comprises a ferromagnetic layer.

8. The method of manufacturing a tunneling magnetoresistive element according to claim 7, wherein the antiferromagnetic insulating layer exhibiting antiferromagnetism is made of $\alpha\text{-}Fe_2O_3$.

9. The method of manufacturing a tunneling magnetoresistive element according to claim 1, wherein in the step (c), during the removal of both sides of the multilayer film, the antiferromagnetic layer is etched out to an intermediate position to form a protrusion that protrudes near a center thereof and base portions that extend from bottom sides of the protrusion toward both sides.

* * * * *